(12) United States Patent
Masuoka et al.

(10) Patent No.: US 10,510,904 B2
(45) Date of Patent: Dec. 17, 2019

(54) SEMICONDUCTOR DEVICE WITH BACKSIDE N-TYPE LAYER AT ACTIVE REGION/TERMINATION REGION BOUNDARY AND EXTENDING INTO ACTION REGION

(71) Applicant: Mitsubishi Electric Corporation, Tokyo (JP)

(72) Inventors: Fumihito Masuoka, Tokyo (JP); Hidenori Fujii, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 35 days.

(21) Appl. No.: 15/519,800

(22) PCT Filed: Feb. 9, 2015

(86) PCT No.: PCT/JP2015/053540
§ 371 (c)(1),
(2) Date: Apr. 17, 2017

(87) PCT Pub. No.: WO2016/129041
PCT Pub. Date: Aug. 18, 2016

(65) Prior Publication Data
US 2017/0263785 A1    Sep. 14, 2017

(51) Int. Cl.
*H01L 29/868*    (2006.01)
*H01L 29/06*    (2006.01)
(Continued)

(52) U.S. Cl.
CPC ........ *H01L 29/868* (2013.01); *H01L 29/0615* (2013.01); *H01L 29/0619* (2013.01);
(Continued)

(58) Field of Classification Search
CPC .............. H01L 29/868; H01L 29/0692; H01L 29/0619; H01L 29/8611; H01L 29/7811
See application file for complete search history.

(56) References Cited

U.S. PATENT DOCUMENTS 5,162,876 A * 11/1992 Kitagawa ............ H01L 29/0804
257/133
5,859,446 A * 1/1999 Nagasu ................. H01L 29/417
257/104
(Continued)

FOREIGN PATENT DOCUMENTS

JP    H04-312981 A    11/1992
JP    H10-093113 A    4/1998
(Continued)

OTHER PUBLICATIONS

Sze et al., Physics of Semiconductor Devices, John Wiley & Sons, Inc., 2007, pp. 187-191.*
(Continued)

*Primary Examiner* — Cuong Q Nguyen
*Assistant Examiner* — Shih Tsun A Chou
(74) *Attorney, Agent, or Firm* — Studebaker & Brackett PC

(57) ABSTRACT

A p type anode layer is formed on a front surface of an n type drift layer in an active region. An n type buffer layer is formed on a rear surface of the $n^-$ type drift layer. An n type cathode layer and a p type cathode layer are formed side by side on a rear surface of the n type buffer layer. An n type layer is formed on the rear surface of the n type buffer layer in a boundary region between the active region and the terminal region side by side with the n type cathode layer and the p type cathode layer. An extending distance of the n type layer to the active region side with an end portion of the
(Continued)

active region as a starting point is represented by WGR1, and WGR1 satisfies 10 μm≤WGR1≤500 μm.

10 Claims, 20 Drawing Sheets

(51) Int. Cl.
   *H01L 29/417* (2006.01)
   *H01L 29/861* (2006.01)
   *H01L 29/16* (2006.01)
   *H01L 29/20* (2006.01)

(52) U.S. Cl.
   CPC ........ *H01L 29/0692* (2013.01); *H01L 29/417* (2013.01); *H01L 29/8611* (2013.01); *H01L 29/1602* (2013.01); *H01L 29/1608* (2013.01); *H01L 29/2003* (2013.01)

(56) References Cited

U.S. PATENT DOCUMENTS

| | | | | |
|---|---|---|---|---|
| 6,552,413 | B1* | 4/2003 | Hirano | H01L 29/861 257/104 |
| 8,847,276 | B2* | 9/2014 | Tanabe | H01L 29/66348 257/139 |
| 9,449,926 | B2* | 9/2016 | Nakanishi | H01L 23/552 |
| 9,601,639 | B2* | 3/2017 | Masuoka | H01L 29/0692 |
| 2007/0108558 | A1* | 5/2007 | Nemoto | H01L 29/36 257/655 |
| 2009/0289276 | A1* | 11/2009 | Yoshiura | H01L 29/0619 257/133 |
| 2010/0308446 | A1* | 12/2010 | Nakamura | H01L 29/0834 257/655 |
| 2011/0291223 | A1* | 12/2011 | Nakamura | H01L 23/3171 257/493 |
| 2012/0132954 | A1* | 5/2012 | Kouno | H01L 29/0619 257/140 |
| 2014/0048847 | A1* | 2/2014 | Yamashita | H01L 29/407 257/140 |
| 2014/0084337 | A1* | 3/2014 | Matsudai | H01L 29/36 257/140 |
| 2015/0364613 | A1* | 12/2015 | Onozawa | H01L 29/8611 257/481 |
| 2016/0307993 | A1* | 10/2016 | Kuribayashi | H01L 21/265 |
| 2017/0069625 | A1* | 3/2017 | Hirabayashi | H01L 27/04 |

FOREIGN PATENT DOCUMENTS

| | | | | |
|---|---|---|---|---|
| JP | 2014-103376 A | 6/2014 | | |
| JP | WO 2014156849 A1 | * 10/2014 | ......... | H01L 29/8611 |
| WO | WO-2013153668 A1 | * 10/2013 | ......... | H01L 29/861 |
| WO | 2014/156849 A1 | 10/2014 | | |

OTHER PUBLICATIONS

An Office Action; "Notification of Reasons for Refusal", issued by the Japanese Patent Office dated Oct. 17, 2017, which corresponds to Japanese Patent Application No. 2016-574544 and is related to U.S. Appl. No. 15/519,800; with English language translation.
International Search Report issued in PCT/JP2015/053540; dated Apr. 7, 2015.
Hidenori Fujii et al.; "A Novel Buffer Structure and Lifetime Control Technique with Poly-Si for Thin Wafer Diode"; Proceedings of ISPSD '09; Jun. 14-18, 2009; pp. 140-143; IEEE; Barcelona, Spain.
Katsumi Nakamura et al.; "Advanced RFC Technology with New Cathode Structure of Field Limiting Rings for High Voltage Planar Diode"; Proceedings of ISPSD '10; Jun. 6-10, 2010; pp. 133-136; IEEE; Hiroshima, Japan.
Fumihito Masuoka et al.; "Great Impact of RFC Technology on Fast Recovery Diode towards 600 V for Low Loss and High Dynamic Ruggedness"; Proceedings of ISPSD '12; Jun. 3-7, 2012; pp. 373-376; IEEE; Bruges, Belgium.

* cited by examiner

FIG. 5
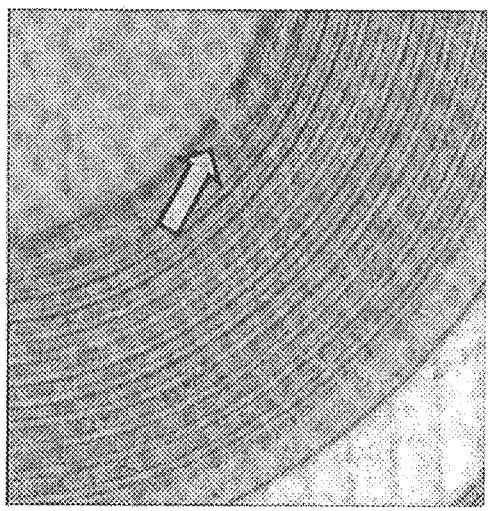
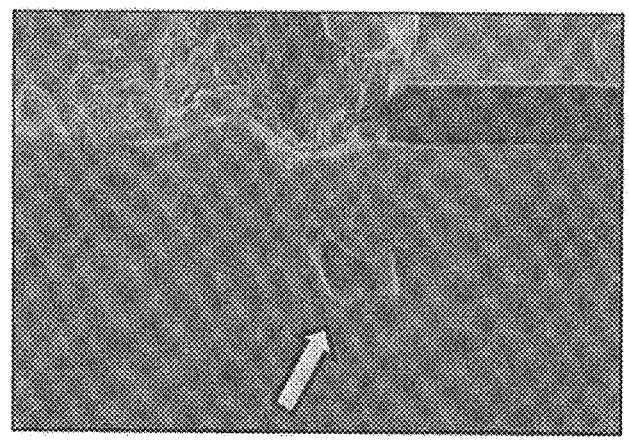
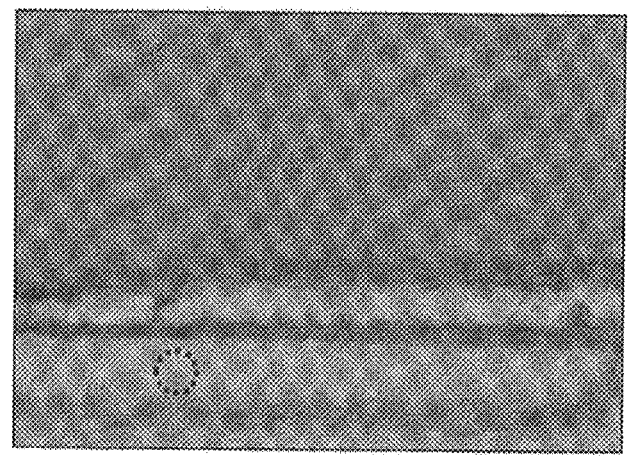

SEMICONDUCTOR DEVICE WITH BACKSIDE N-TYPE LAYER AT ACTIVE REGION/TERMINATION REGION BOUNDARY AND EXTENDING INTO ACTION REGION

FIELD

The present invention relates to a semiconductor device used for a high withstand voltage power module (≥600 V).

BACKGROUND ART

Conventional diodes have reduced a forward voltage drop VF by applying a thin wafer process and optimizing a cathode profile (e.g., see NPL 1). Wafer thinning is also effective for diodes to achieve low VF as in the case of IGBT (insulated gate bipolar transistor), which, however, leads to a reduction of the tolerance of snap-off during recovery, increasing the risk of a breakdown of the device.

Diodes targeted for a high withstand voltage class have sought to improve a recovery SOA (safe operating area) by reducing a carrier concentration in a terminal region in an ON-state by a p-layer formed on a rear side of the terminal region and suppressing carrier concentration on a boundary region during recovery (e.g., see NPL 2).

Furthermore, it has been verified also in low to medium withstand voltage classes of 600 to 1700 V that it is possible to increase electric field strength on a cathode side in addition to a main junction using p type layers and n type layers alternately formed on the rear surface side of the active region, suppress a snap-off phenomenon, and reduce total loss through the benefit of a thickness reduction of an $n^-$ type drift layer (e.g., see NPL 3).

On the other hand, in order to reduce total loss while securing a withstand voltage, if the substrate concentration is increased and the $n^-$ type drift layer is designed to have a smaller thickness, a breakdown occurs simultaneously with an avalanche in the vicinity of a breakdown starting point which substantially exceeds a rated voltage during measurement of static dielectric strength. Thus, there is a limitation on the reduction of wafer thickness for applications requiring an operation guarantee in the event of an avalanche.

CITATION LIST

Non Patent Literature

NPL 1: H. Fujii, M. Inoue, K. Hatade and Y. Tomomatsu, "A Novel Buffer Structure and lifetime control Technique with Poly-Si for Thin Wafer Diode," Proc. ISPSD'09, pp. 140-143, Barcelona, Spain (2009)

NPL 2: K. Nakamura, F. Masuoka, A. Nishii, K. Sadamatsu, S. Kitajima and K. Hatade, "Advanced RFC Technology with New Cathode Structure of Field Limiting Rings for High Voltage Planar Diode," Proc. ISPSD' 10, pp. 133-136, Hiroshima, Japan (2010)

NPL 3: F. Masuoka, K. Nakamura, A. Nishii and T. Terashima, "Great Impact of RFC Technology on Fast Recovery Diode towards 600 V for Low Loss and High Dynamic Ruggedness," Proc. ISPSD' 12, pp. 373-376, Bruges, Belgium (2012)

SUMMARY

Technical Problem

In order to reduce total loss while maintaining static dielectric strength, it is necessary to make the wafer thinner and design higher specific resistance. However, with a pin diode designed in such a way, the electric field increases not only in the main junction but also in a junction between the $n^-$ type layer and the $n^+$ type layer on the cathode side during recovery, carriers which are left behind inside the drift layer are drastically swept out in the final phase of the recovery, resulting in a drastic interruption of tail current (snap-off). The problem is that this triggers a surge voltage due to a back electromotive force of parasitic inductance Ls in the circuit and an oscillation phenomenon due to L and C in the circuit.

Conventional pin diodes have a termination rear surface structure whose total surface is made up of an $n^+$ type layer, and therefore they have a high carrier concentration in a terminal region from an ON-state. Therefore, during a turn-off operation, positive holes concentrate on a contact end in the boundary between the active region and the terminal region, resulting in a problem that the temperature locally increases (≥800K), which may lead to a breakdown.

Furthermore, devices including a parasitic pnp bipolar transistor structure have a problem that the avalanche resistance deteriorates during an off-operation and a turn-off operation compared to devices including no parasitic structure.

The present invention has been implemented to solve the above-described problems and it is an object of the present invention to provide a semiconductor device capable of suppressing a snap-off phenomenon in the final phase of a turn-off operation and an oscillation phenomenon thereby triggered, preventing a breakdown in a boundary between the active region and the terminal region during a turn-off operation, and improving avalanche resistance during an off-operation and turn-off operation.

Solution to Problem

A semiconductor device according to the present invention wherein a terminal region is disposed outside an active region, includes: an n type drift layer having a front surface and a rear surface facing each other; a p type anode layer formed on the front surface of the n type drift layer in the active region; an n type buffer layer formed on the rear surface of the n type drift layer; an n type cathode layer and a p type cathode layer formed side by side on a rear surface of the n type buffer layer; and an n type layer formed on the rear surface of the n type buffer layer in a boundary region between the active region and the terminal region side by side with the n type cathode layer and the p type cathode layer, wherein an extending distance of the n type layer to the active region side with an end portion of the active region as a starting point is represented by WGR1, and WGR1 satisfies 10 μm≤WGR1≤500 μm.

Advantageous Effects of Invention

In the present invention, the n type layer is formed on the rear surface of the n type buffer layer in the boundary region between the active region and the terminal region, and WGR1 which represents an extending distance of the n type layer to the active region side satisfies 10 μm≤WGR1≤500 μm. This makes it possible to suppress a snap-off phenomenon and an oscillation phenomenon triggered thereby at the end of the turn-off operation and improve avalanche resistance during an off-operation and a turn-off operation.

BRIEF DESCRIPTION OF THE DRAWINGS

FIG. 5 is a diagram illustrating samples of the conventional structure which have undergone an avalanche breakdown.

DESCRIPTION OF EMBODIMENTS

A semiconductor device according to the embodiments of the present invention will be described with reference to the drawings. The same components will be denoted by the same symbols, and the repeated description thereof may be omitted.

Embodiment 1

Figure 1:
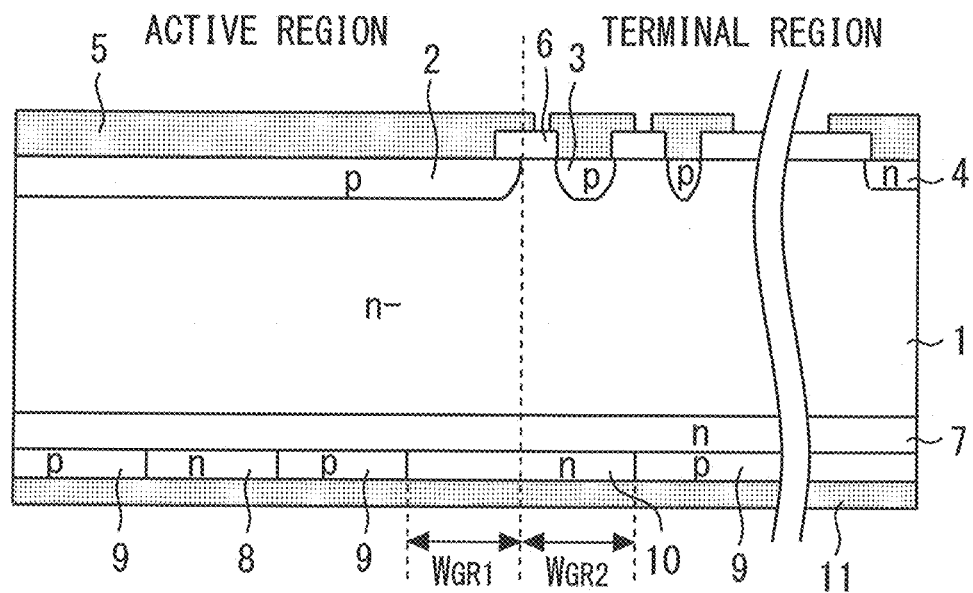
FIG. 1 is a cross-sectional view illustrating a semiconductor device according to Embodiment 1 of the present invention.

FIG. 1 is a cross-sectional view illustrating a semiconductor device according to Embodiment 1 of the present invention. A terminal region is disposed outside an active region. An $n^-$ type drift layer 1 has a front surface and a rear surface facing each other.

A p type anode layer 2 is formed on a front surface of the n type drift layer 1 in the active region. An end portion of the p type anode layer 2 coincides with an end portion of the active region. A typical p type guard ring layer 3 and a channel stopper layer 4 are formed on the surface of the $n^-$ type drift layer 1 in the terminal region. An anode electrode 5 forms an ohmic contact with the p type anode layer 2 via an opening of an interlayer film 6.

An n type buffer layer 7 is formed on a rear surface of the $n^-$ type drift layer 1. An n type cathode layer 8 and a p type cathode layer 9 are formed side by side on a rear surface of the n type buffer layer 7. An n type layer 10 is formed on the rear surface of the n type buffer layer 7 in a boundary region between the active region and the terminal region side by side with the n type cathode layer 8 and the p type cathode layer 9. The n type layer 10 has the same impurity concentration as that of the n type cathode layer 8. A cathode electrode 11 forms an ohmic contact with the n type cathode layer 8, the p type cathode layer 9 and the n type layer 10.

An extending distance of the n type layer 10 to the active region side with an end portion of the active region as a starting point is represented by WGR1. An extending distance of the n type layer 10 to the terminal region side with an end portion of the active region as a starting point is represented by WGR2. WGR1 and WGR2 satisfy 10 µm≤WGR1≤500 µm and 10 µm≤WGR2≤500 µm.

Of electron-hole pairs generated by collision and ionization at the end portion of the p type anode layer 2 when a reverse bias is applied, electrons pass through a high electric field and move toward the cathode electrode 11. Operation of a parasitic pnp transistor can be suppressed by securing a loophole for the electrons through the n type layer 10 at this time. To attain this effect, both WGR1 and WGR2 are preferably designed to be on the order of several tens of µm.

Note that when the extending shape of a depletion layer is taken into consideration, WGR2 needs to be designed to be greater than WGR1.

Figure 2:
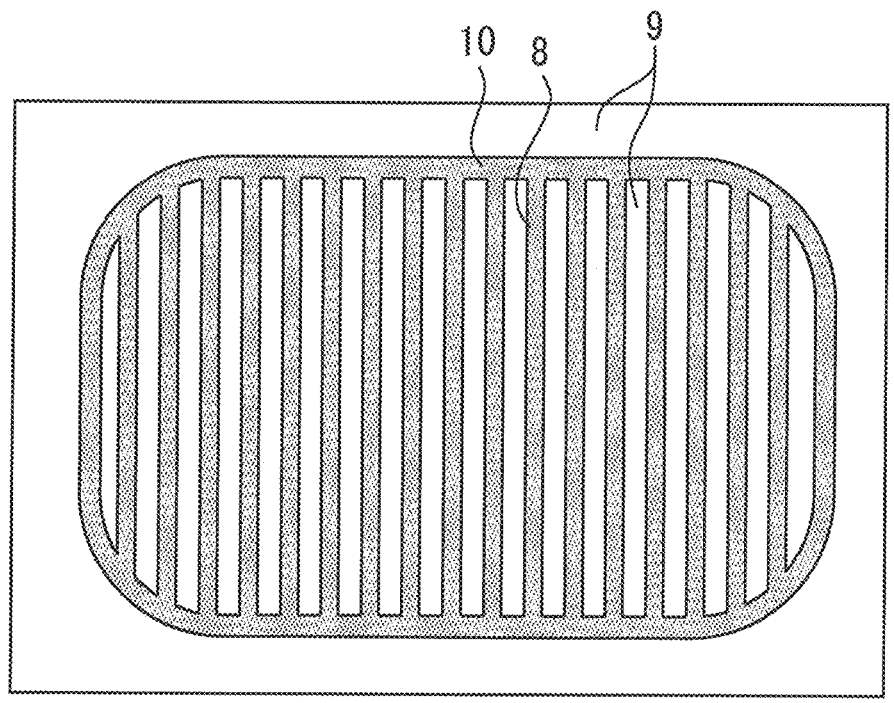
FIG. 2 is a bottom view illustrating the semiconductor device according to Embodiment 1 of the present invention.
Figure 3:
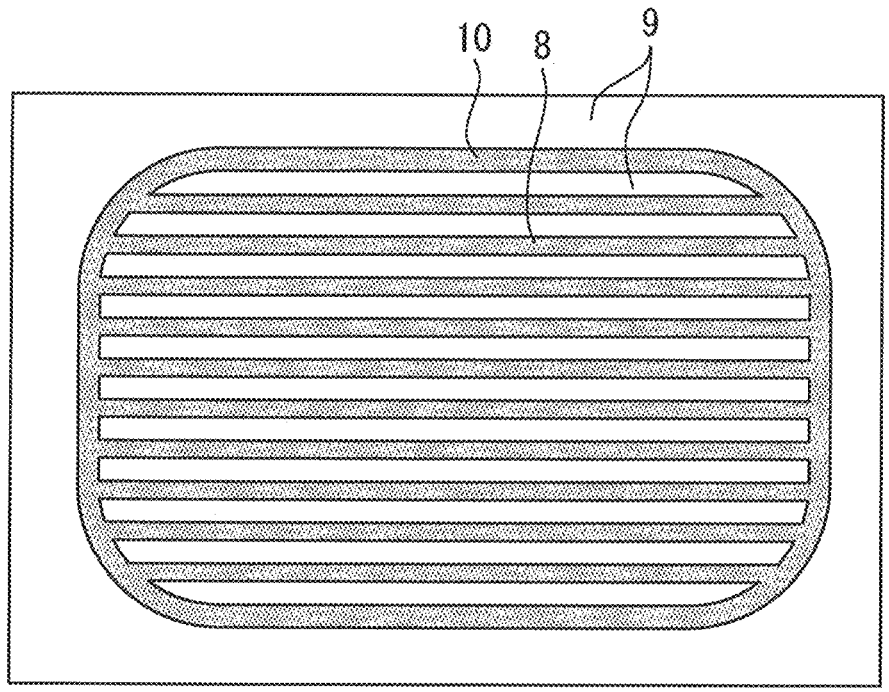
FIG. 3 is a bottom view illustrating a modification of the semiconductor device according to Embodiment 1 of the present invention.
Figure 4:
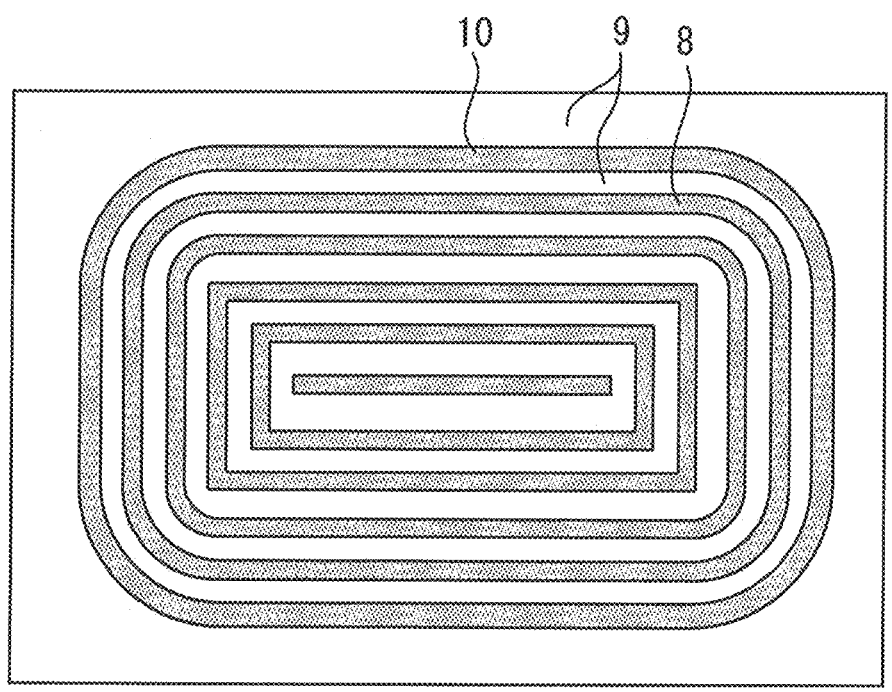
FIG. 4 is a bottom view illustrating a modification of the semiconductor device according to Embodiment 1 of the present invention.

FIG. 2 is a bottom view illustrating the semiconductor device according to Embodiment 1 of the present invention. A pattern of the p type cathode layers 9 and the n type cathode layers 8 is arranged in a grid shape perpendicular to the long side of the chip. FIGS. 3 and 4 are bottom views illustrating modifications of the semiconductor device according to Embodiment 1 of the present invention. In FIG. 3, a pattern of the p type cathode layers 9 and the n type cathode layers 8 is arranged in a grid shape parallel to the long side of the chip. In FIG. 4, a pattern of the p type cathode layers 9 and the n type cathode layers 8 is arranged in a ring shape.

Next, a conventional structure in which the p type cathode layer 9 is formed in the boundary region and the terminal region will be compared with the present embodiment in which the n type layer 10 is formed. Both are diodes in which an FLR (field limiting ring) structure is formed on the surface of the terminal region and a repeating structure of the p layer and the n layer is formed on the rear surface of the active region.

FIG. 5 is a diagram illustrating samples of the conventional structure which have undergone an avalanche breakdown. In all samples which have undergone an avalanche breakdown, Si bumps were observed at chip corner anode end portions and molten traces were found in Si near directly below the interlayer films. It is possible to assume from this result that a thermal breakdown due to an overcurrent may have occurred at the final phase of the breakdown mechanism.

Figure 6:
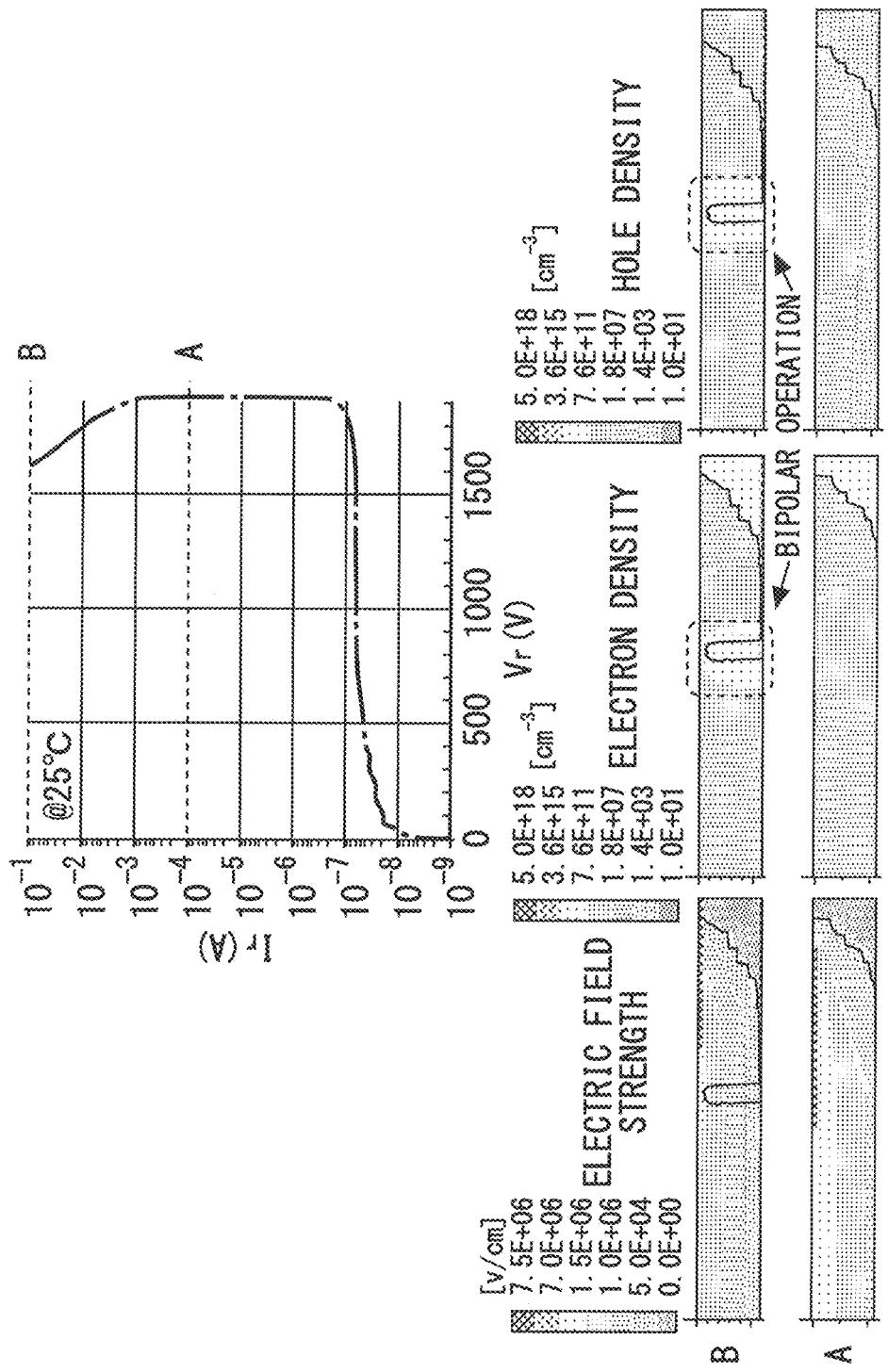
FIG. 6 is a diagram illustrating simulation results of an inner state when a reverse bias is applied.

FIG. 6 is a diagram illustrating simulation results of an inner state when a reverse bias is applied. As a result of simulating a withstand voltage characteristic at room temperature, a negative differential resistance (NDR) region appeared in the vicinity of a breakdown starting point substantially exceeding a rated voltage and the withstand voltage waveform described an "S-figure." As a result of observing the inner state of the device with the respective current values, it has been appreciated that electrons and positive holes exist at a high density in the longitudinal direction of the device at the contact end in the NDR region (bipolar operation), showing a possibility that the avalanche breakdown may be a secondary breakdown of a longitudinal parasitic pnp transistor structure at the contact end. On the other hand, the present embodiment has improved the avalanche resistance. From these results, it is possible to assume that the principles of an avalanche breakdown of the conventional structure are basically similar to the principles of a secondary breakdown of a bipolar transistor "operation of carriers generated by collision and ionization under a high electric field functioning as a base current and continuing an on-operation."

Figure 7:
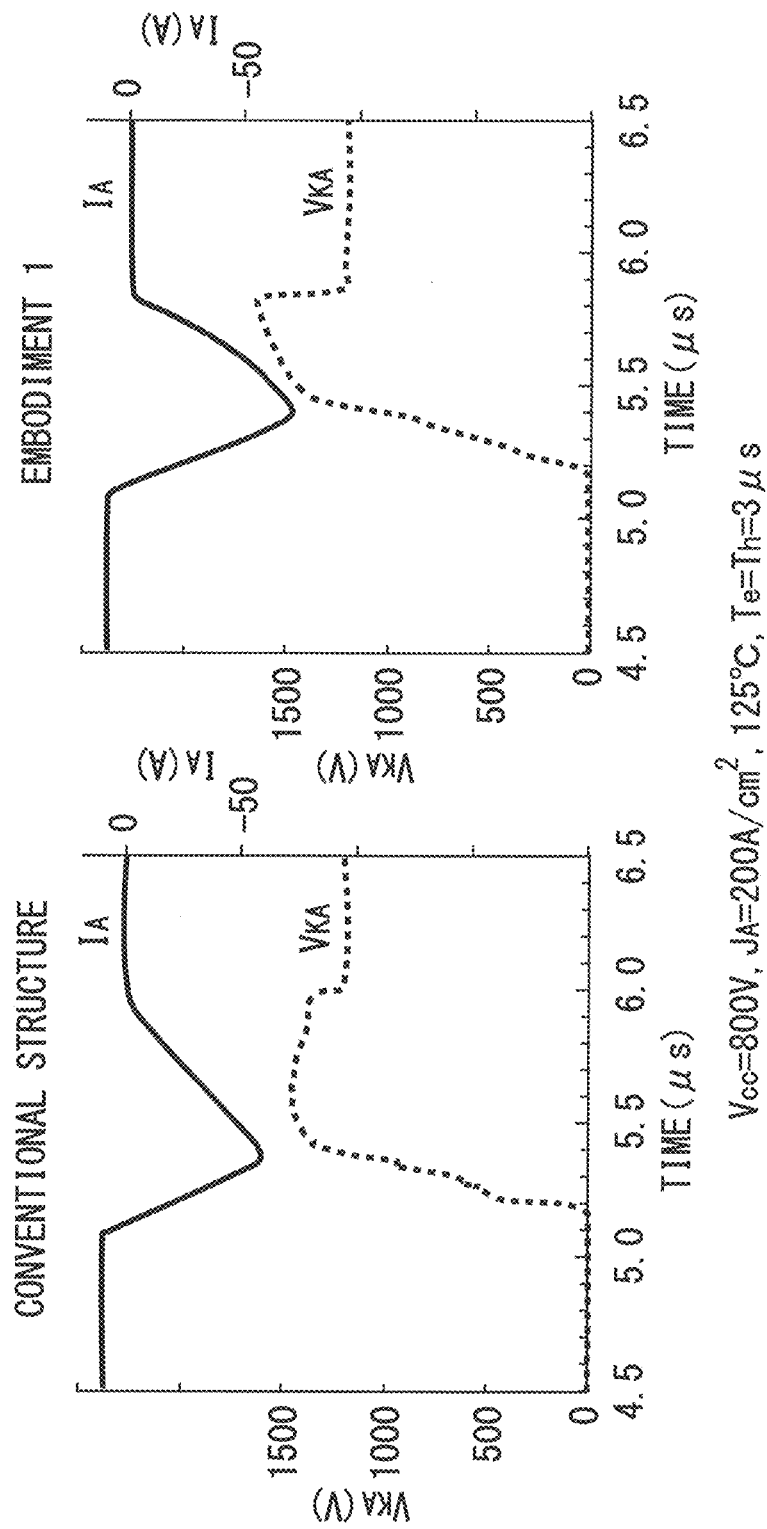
FIG. 7 is a diagram simulating a recovery characteristic.
Figure 8:
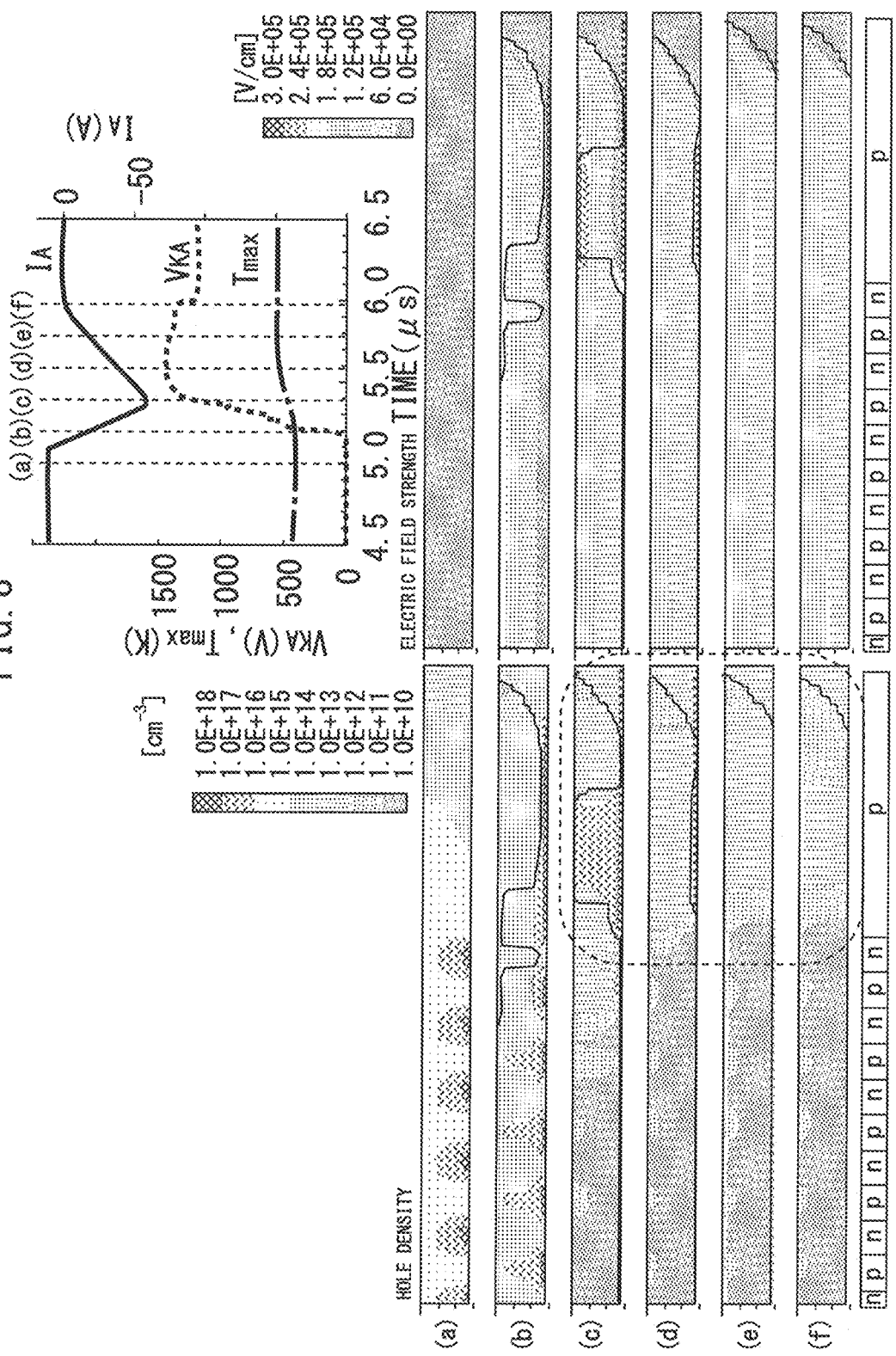
FIG. 8 is a diagram illustrating a positive hole density and electric field strength of a conventional structure.
Figure 9:
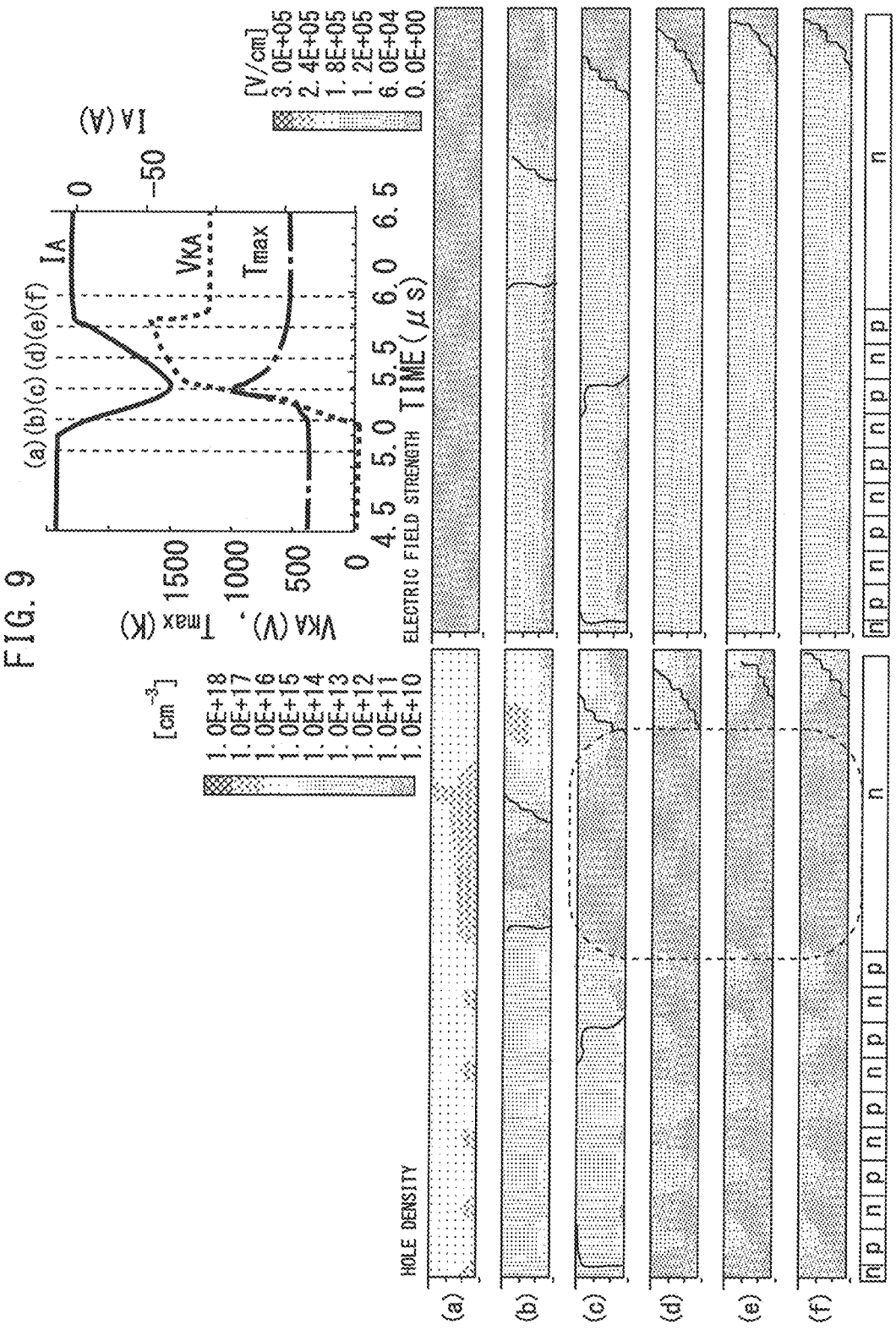
FIG. 9 is a diagram illustrating a positive hole density and electric field strength of the present embodiment.

FIG. 7 is a diagram simulating a recovery characteristic. FIG. 8 is a diagram illustrating a positive hole density and electric field strength of a conventional structure and FIG. 9 is a diagram illustrating a positive hole density and electric field strength of the present embodiment. The present embodiment has obtained results with a higher surge voltage than the conventional structure. From an internal analysis made at each timing of recovery to investigate causes for surge voltage rises, it has been appreciated that in the conventional structure, a depletion layer gently extends toward the cathode side directly above the p type cathode layer on the rear surface of the terminal region, whereas in the present embodiment, the depletion layer drastically extends toward the cathode side directly above the n type layer on the rear surface of the terminal region.

Furthermore, when a UIS test of the conventional structure was simulated, a device breakdown in the vicinity of a voltage peak was successfully simulated. Results of an internal analysis at each timing show that an internal state at the time of a device breakdown is quite similar to the simulated internal state at the time of application of the above-described reverse bias. Therefore, it has been appreciated that an improvement can be made by forming the n type layer on the rear surface of the boundary region between the active region and the terminal region.

Figure 10:
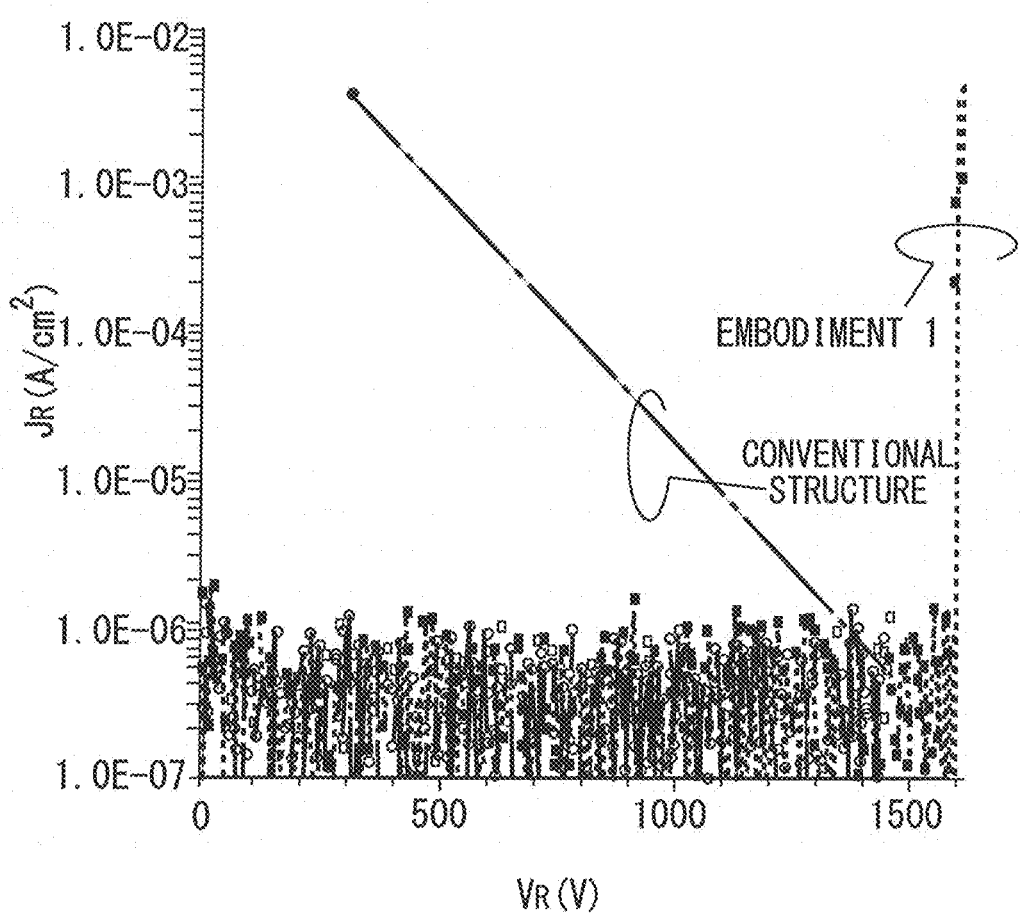
FIG. 10 is a diagram illustrating results of measuring a room temperature withstand voltage characteristic of a 1200 V prototype lot.

FIG. 10 is a diagram illustrating results of measuring a room temperature withstand voltage characteristic of a 1200 V prototype lot. In the case of the conventional structure with a p type cathode layer formed on the rear surface of the terminal region, the structure was destroyed simultaneously with the start of a breakdown near 1500 V. On the other hand, in the case of the present embodiment in which the n type layer is formed on the rear surface at an end portion of the active region, avalanche resistance has been successfully improved as intended.

Figure 11:
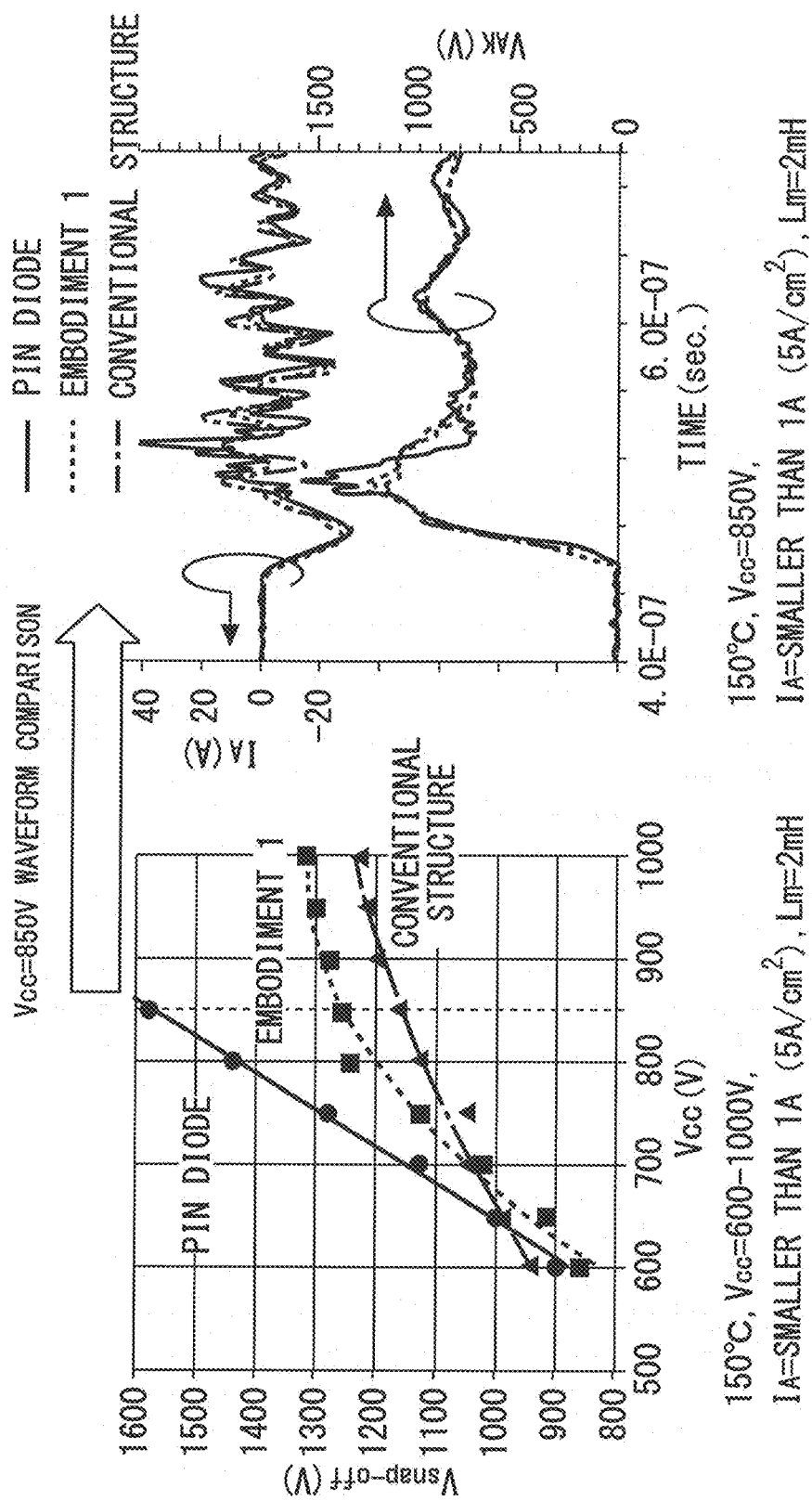
FIG. 11 is a diagram illustrating a snap-off characteristic.

FIG. 11 is a diagram illustrating a snap-off characteristic. A voltage waveform peak value Vsnap-off when a snap-off characteristic of the present embodiment is evaluated is higher by approximately 100 V than the conventional structure when compared at Vcc=850 V, but is lower by 300 V or more than the pin diode. Therefore, it is appreciated that RFC effects can be maintained.

Figure 12:
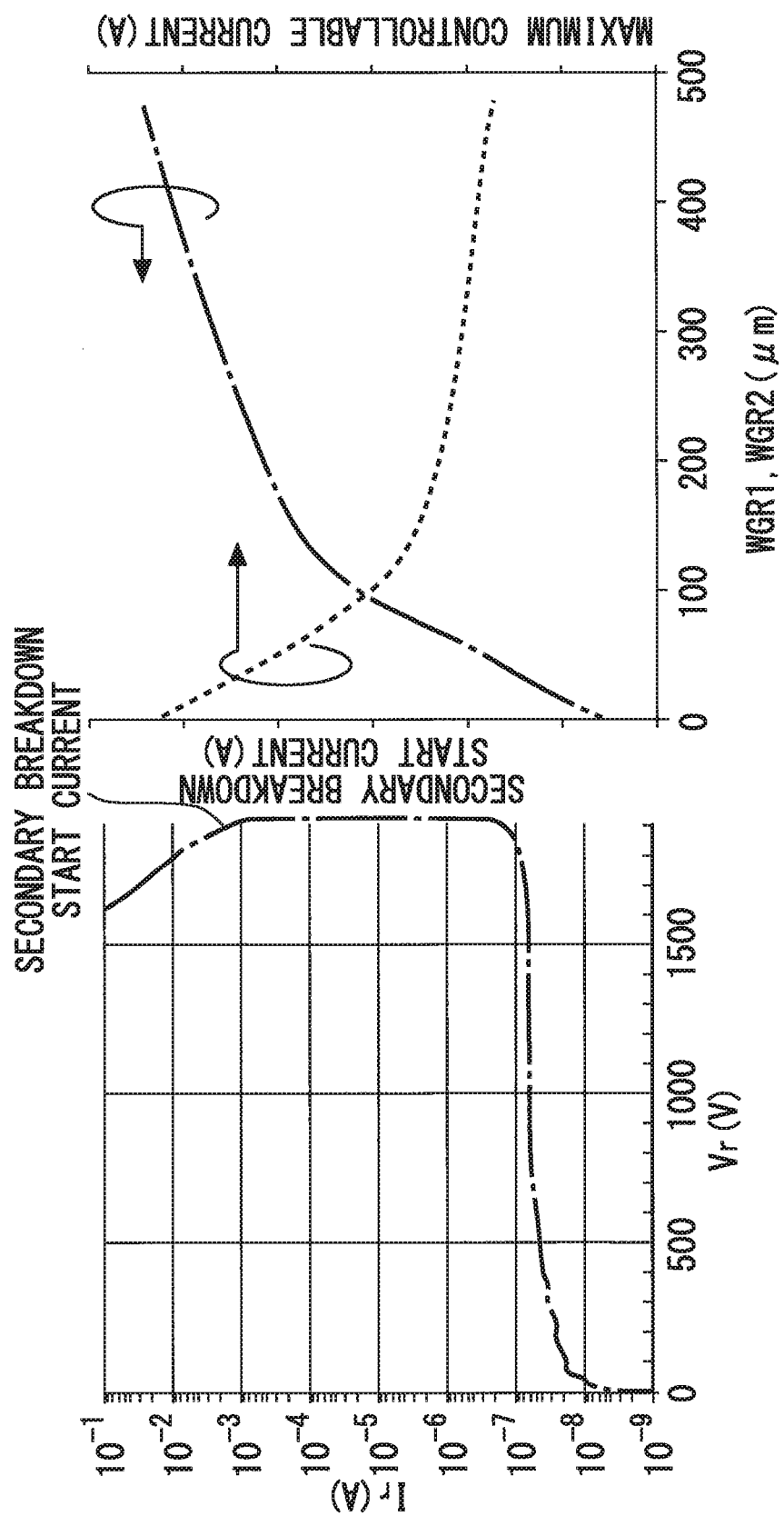
FIG. 12 is a diagram illustrating WGR1 and WGR2 dependencies of a secondary breakdown start current and a maximum controllable current.

FIG. 12 is a diagram illustrating WGR1 and WGR2 dependencies of a secondary breakdown start current and a maximum controllable current. As WGR1 or WGR2 approaches 0, the secondary breakdown start current decreases, whereas the maximum controllable current increases. On the other hand, as WGR1 or WGR2 increases, the maximum controllable current decreases, whereas the secondary breakdown start current increases. Thus, WGR1 and WGR2 need to satisfy 10 μm≤WGR1≤500 μm and 10 μm≤WGR2≤500 μm.

As described above, in the present embodiment, the n type layer 10 is formed on the rear surface in the boundary region between the active region and the terminal region, and a parasitic pnp transistor operation is thereby suppressed, and it is thereby possible to prevent a breakdown in the boundary between the active region and the terminal region during a turn-off operation and improve avalanche resistance during an off-operation and a turn-off operation. However, electric field concentration is likely to occur at an end portion of the active region due to a curvature of a diffusion layer, and a drastic depletion of carriers inside the device which constitutes a trigger of voltage/current waveform vibration during a recovery operation is likely to occur first. For this reason, the more the p type cathode layer 9 is separated from the end portion of the active region, the more likely it is to cause voltage/current waveform vibration during a recovery operation. Therefore, the present embodiment makes a setting so that extending distances WGR1 and WGR2 of the n type layer 10 to the active region side and the terminal region side respectively satisfy 10 μm≤WGR1≤500 μm and 10 μm≤WGR2≤500 μm, respectively. This makes it possible to suppress a snap-off phenomenon and an oscillation phenomenon triggered thereby at the end of the turn-off operation.

Embodiment 2

Figure 13:
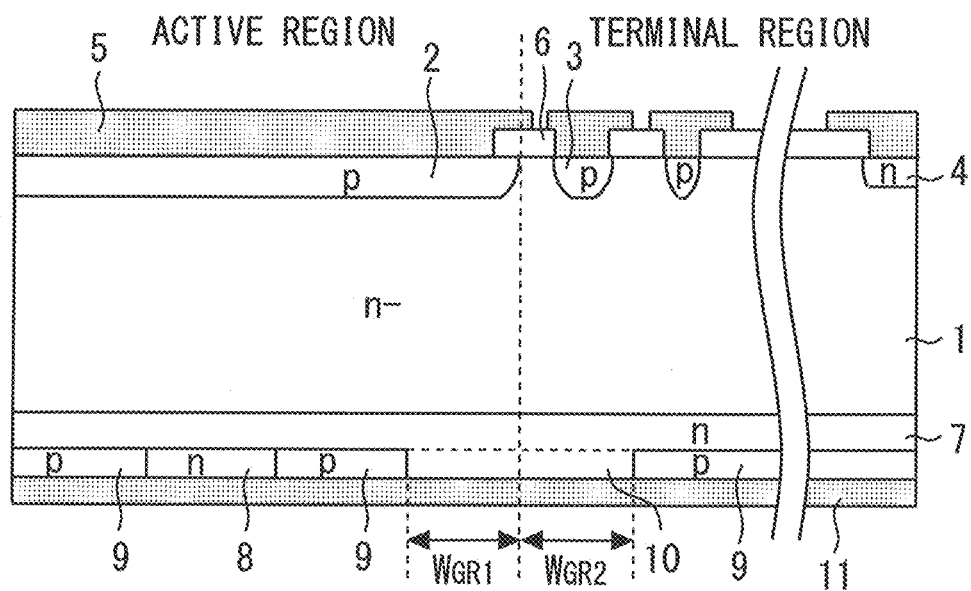
FIG. 13 is a cross-sectional view illustrating a semiconductor device according to Embodiment 2 of the present invention.
Figure 14:
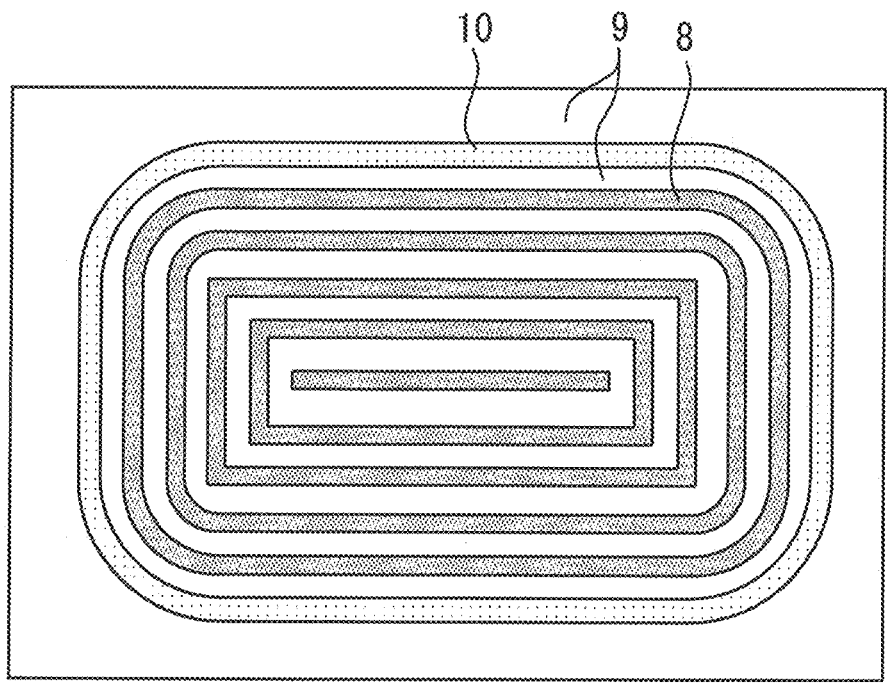
FIG. 14 is a bottom view illustrating the semiconductor device according to Embodiment 2 of the present invention.

FIG. 13 is a cross-sectional view illustrating a semiconductor device according to Embodiment 2 of the present invention. FIG. 14 is a bottom view illustrating the semiconductor device according to Embodiment 2 of the present invention. In the present embodiment, the n type layer 10 has the same impurity concentration as that of the n type buffer layer 7. The rest of the configuration is the same as that of Embodiment 1 and effects similar to those of Embodiment 1 can be obtained.

Embodiment 3

Figure 15:
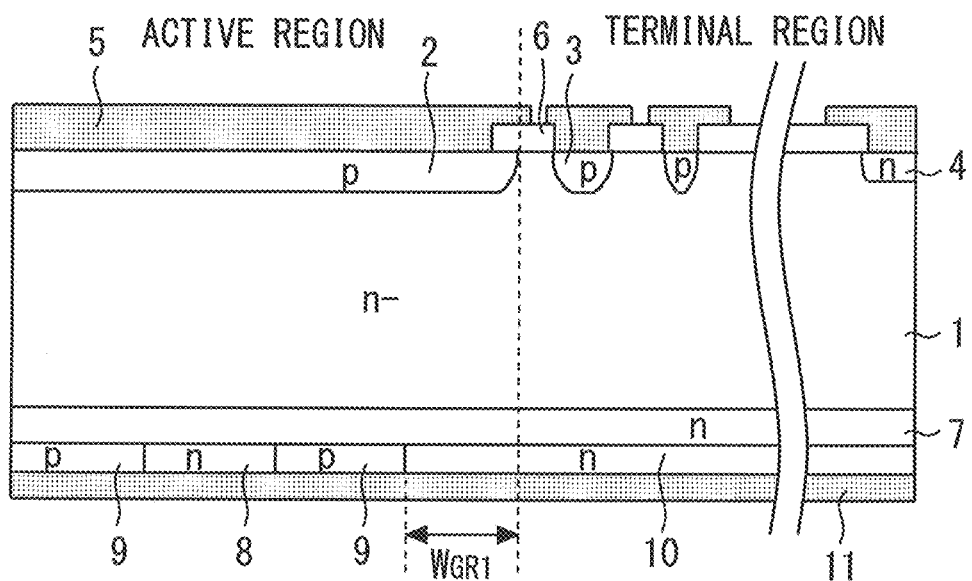
FIG. 15 is a cross-sectional view illustrating a semiconductor device according to Embodiment 3 of the present invention.
Figure 16:
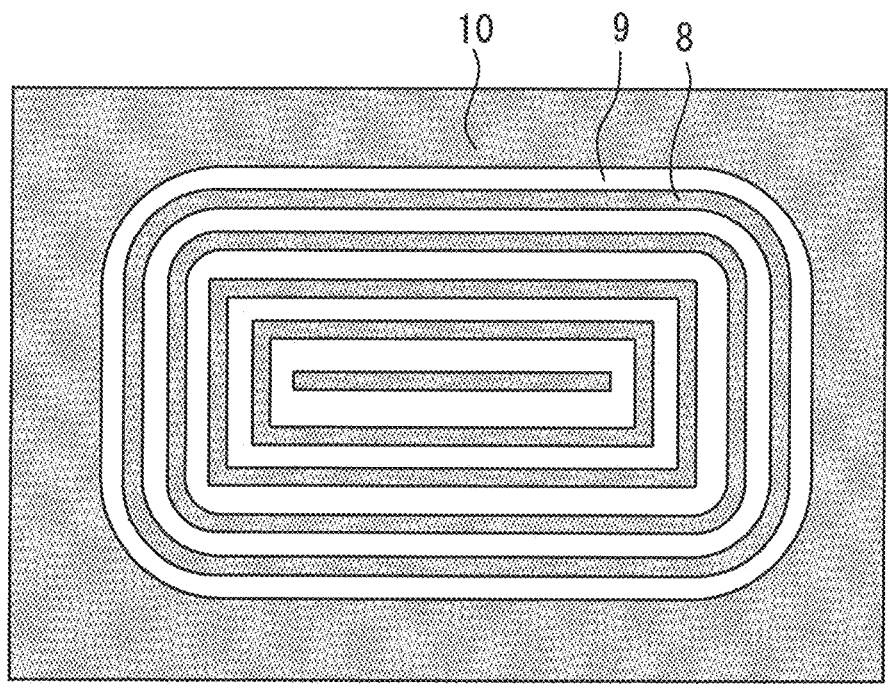
FIG. 16 is a bottom view illustrating the semiconductor device according to Embodiment 3 of the present invention.

FIG. 15 is a cross-sectional view illustrating a semiconductor device according to Embodiment 3 of the present invention. FIG. 16 is a bottom view illustrating the semiconductor device according to Embodiment 3 of the present invention. In the present embodiment, no p type cathode layer 9 is formed in the terminal region. The rest of the configuration is the same as that of Embodiment 1 and effects similar to those of Embodiment 1 can be obtained.

Embodiment 4

Figure 17:
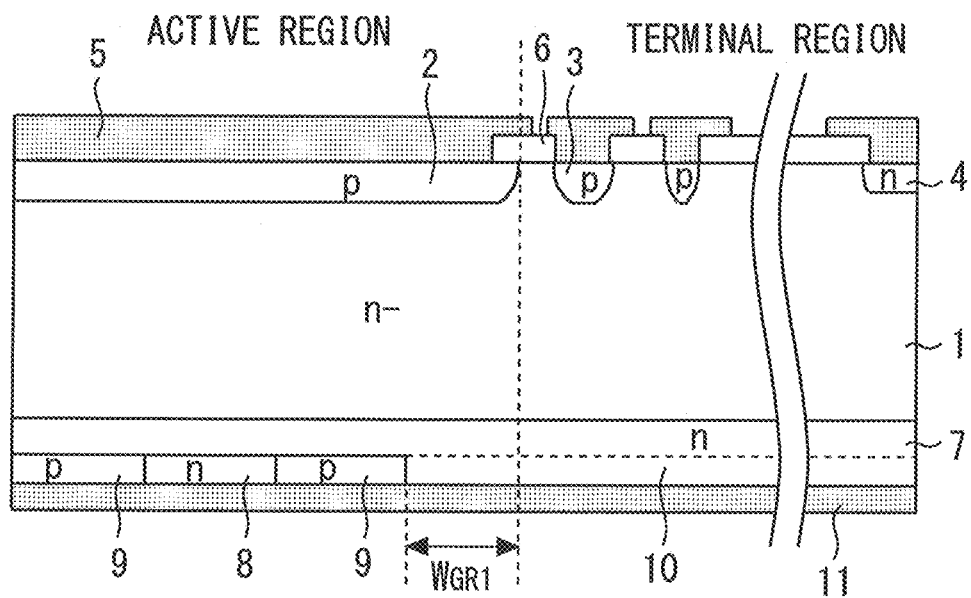
FIG. 17 is a cross-sectional view illustrating a semiconductor device according to Embodiment 4 of the present invention.
Figure 18:
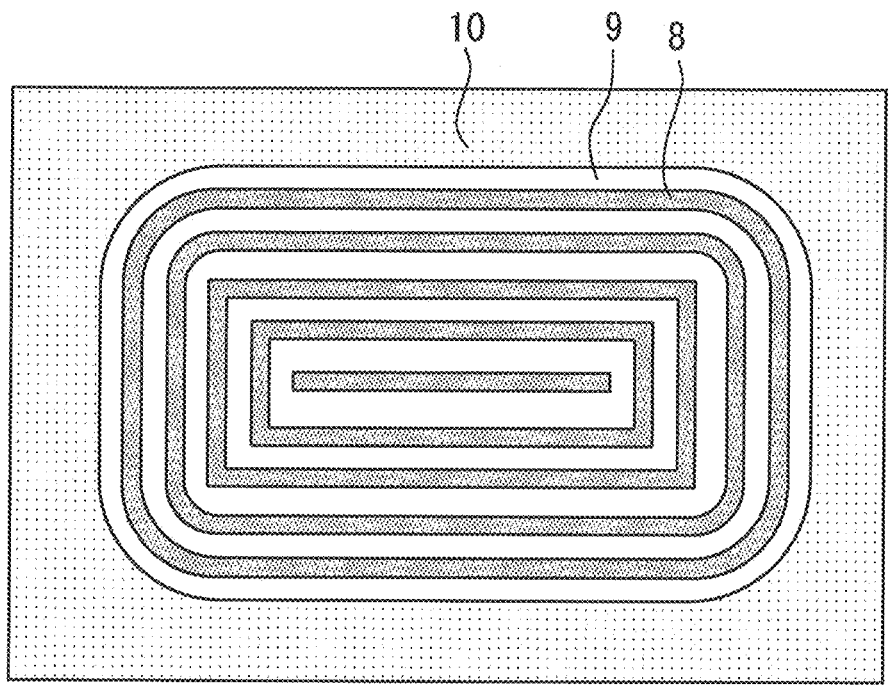
FIG. 18 is a bottom view illustrating the semiconductor device according to Embodiment 4 of the present invention.

FIG. 17 is a cross-sectional view illustrating a semiconductor device according to Embodiment 4 of the present invention. FIG. 18 is a bottom view illustrating the semiconductor device according to Embodiment 4 of the present invention. In the present embodiment, the n type layer 10 has the same impurity concentration as that of the n type buffer layer 7 and no p type cathode layer 9 is formed in the terminal region. The rest of the configuration is the same as that of Embodiment 1 and effects similar to those of Embodiment 1 can be obtained.

Embodiment 5

Figure 19:
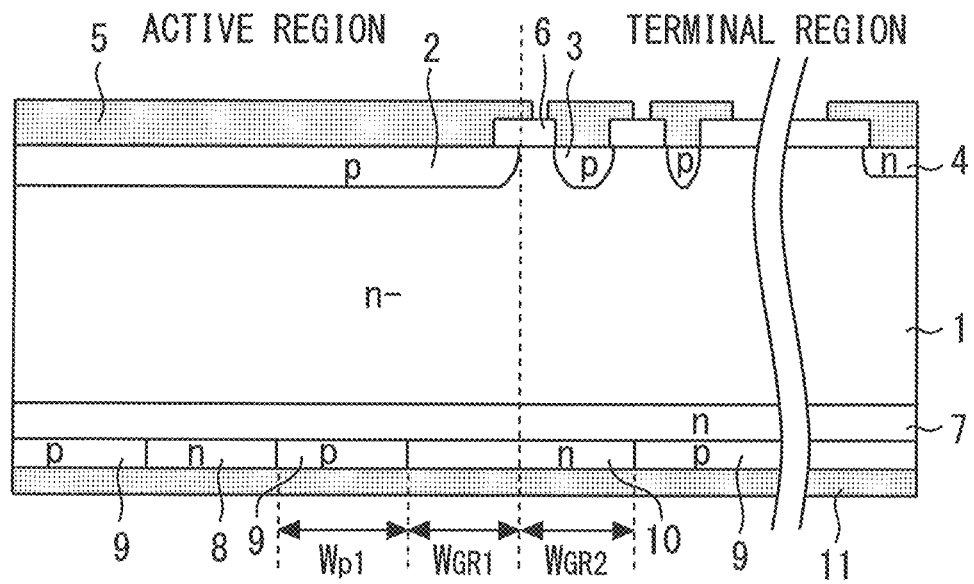
FIG. 19 is a cross-sectional view illustrating a semiconductor device according to Embodiment 5 of the present invention.

FIG. 19 is a cross-sectional view illustrating a semiconductor device according to Embodiment 5 of the present invention. In the present embodiment, the p type cathode layer 9 having a width Wp1 is located adjacent to an end portion on the active region side of the n type layer 10. The rest of the configuration is the same as that of Embodiment 1 and effects similar to those of Embodiment 1 can be obtained.

Here, of electron-hole pairs generated by collision and ionization at the end portion of the p type anode layer 2 at the time of application of a reverse bias, electrons move toward the cathode in a high electric field. When a voltage drop caused by an electronic current directed to the n type layer 10 in the active region bypassing the n type buffer layer 7 directly above the p type cathode layer 9 exceeds an internal potential Vin between the p type cathode layer 9 and the n type buffer layer 7, this induces a parasitic pnp transistor operation. When it is assumed that resistivity of the n type buffer layer 7 is $\rho_{buffer}$ and an electronic current is $I_e$, the internal potential Vin is given as Vin=$\int \rho_{buffer} \cdot I_e \cdot xdx$. For example, if $I_e$ is 200 A/cm², an acceptor density NA of the p type cathode layer 9 is 1E17/cm³, a donor density ND of the n type buffer layer 7 is 3E16/cm³, a peak concentration $N_{buffer}$ of the n type buffer layer 7 is 3E16/cm², a thickness of the n type buffer layer 7 is 1.5 µm, and a temperature is 300K, Wp1 to exceed an internal potential of approximately 0.79 V is derived to be approximately 58.5 µm. It is thereby possible to suppress parasitic pnp transistor operation. To achieve this effect, the width Wp1 is preferably designed to be on the order of several tens of µm.

Embodiment 6

Figure 20:
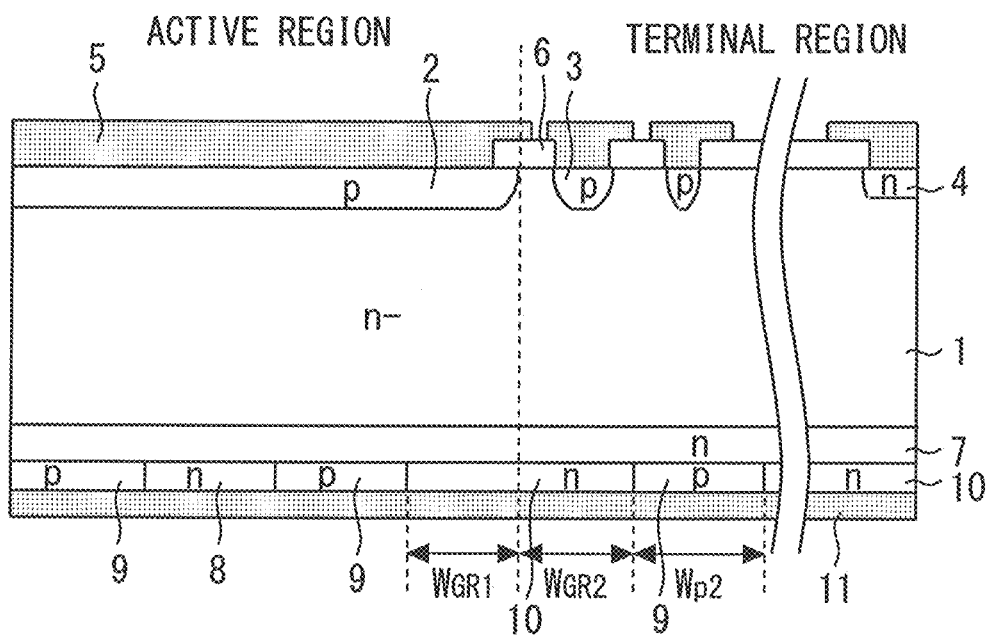
FIG. 20 is a cross-sectional view illustrating a semiconductor device according to Embodiment 6 of the present invention.

FIG. 20 is a cross-sectional view illustrating a semiconductor device according to Embodiment 6 of the present invention. In the present embodiment, the p type cathode layer 9 having a width Wp2 is located adjacent to an end portion on the terminal region side of the n type layer 10. The rest of the configuration is the same as that of Embodiment 1 and effects similar to those of Embodiment 1 can be obtained. The width Wp2 is preferably designed to be on the order of several tens of µm as in the case of Embodiment 5.

Embodiment 7

Figure 21:
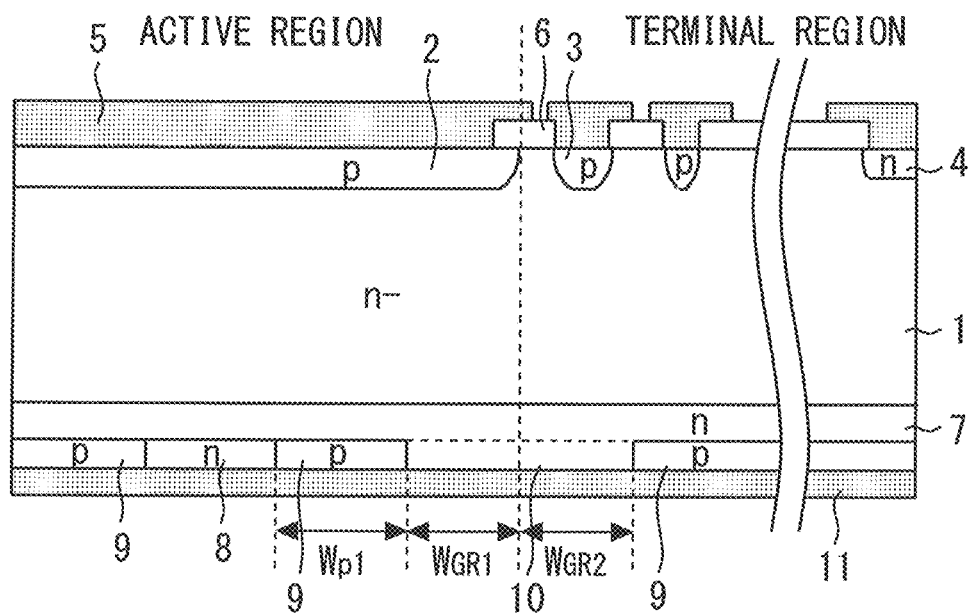
FIG. 21 is a cross-sectional view illustrating a semiconductor device according to Embodiment 7 of the present invention.

FIG. 21 is a cross-sectional view illustrating a semiconductor device according to Embodiment 7 of the present invention. In the present embodiment, the n type layer 10 has the same impurity concentration as that of the n type buffer layer 7. The rest of the configuration is the same as that of Embodiment 5 and effects similar to those of Embodiment 5 can be obtained.

Embodiment 8

Figure 22:
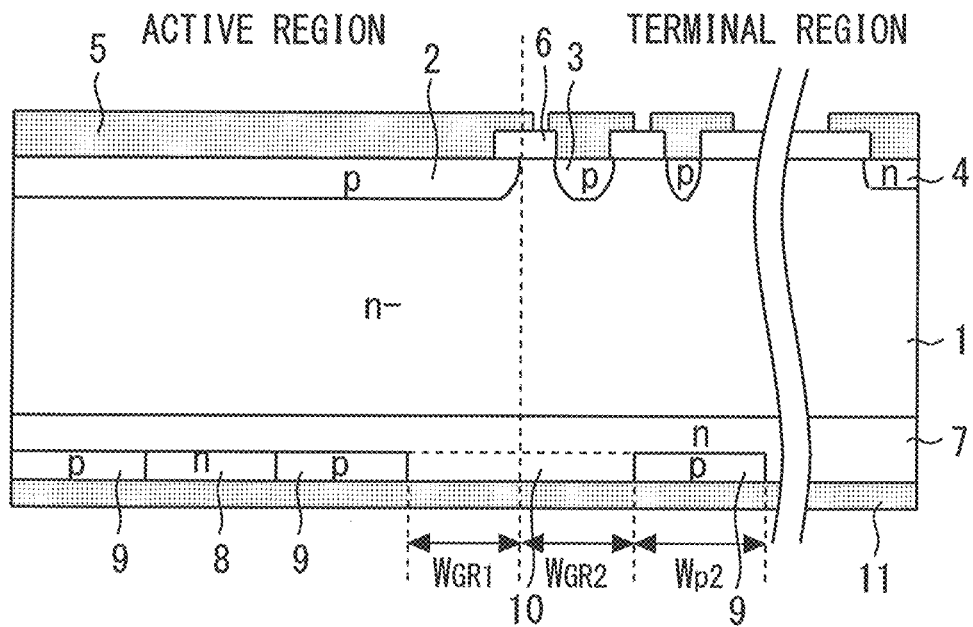
FIG. 22 is a cross-sectional view illustrating a semiconductor device according to Embodiment 8 of the present invention.

FIG. 22 is a cross-sectional view illustrating a semiconductor device according to Embodiment 8 of the present invention. In the present embodiment, the n type layer 10 has the same impurity concentration as that of the n type buffer layer 7. The rest of the configuration is the same as that of Embodiment 6 and effects similar to those of Embodiment 6 can be obtained.

Embodiment 9

Figure 23:
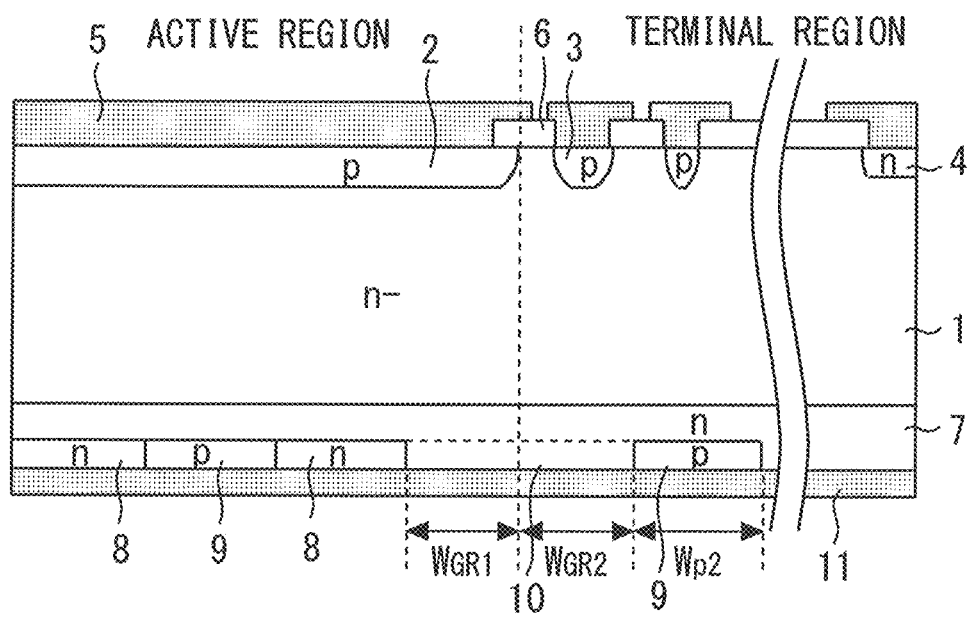
FIG. 23 is a cross-sectional view illustrating a semiconductor device according to Embodiment 9 of the present invention.

FIG. 23 is a cross-sectional view illustrating a semiconductor device according to Embodiment 9 of the present invention. In the present embodiment, the n type cathode layer 8 is located adjacent to the end portion on the active region side of the n type layer 10. The rest of the configuration is the same as that of Embodiment 8 and effects similar to those of Embodiment 8 can be obtained.

Embodiment 10

Figure 24:
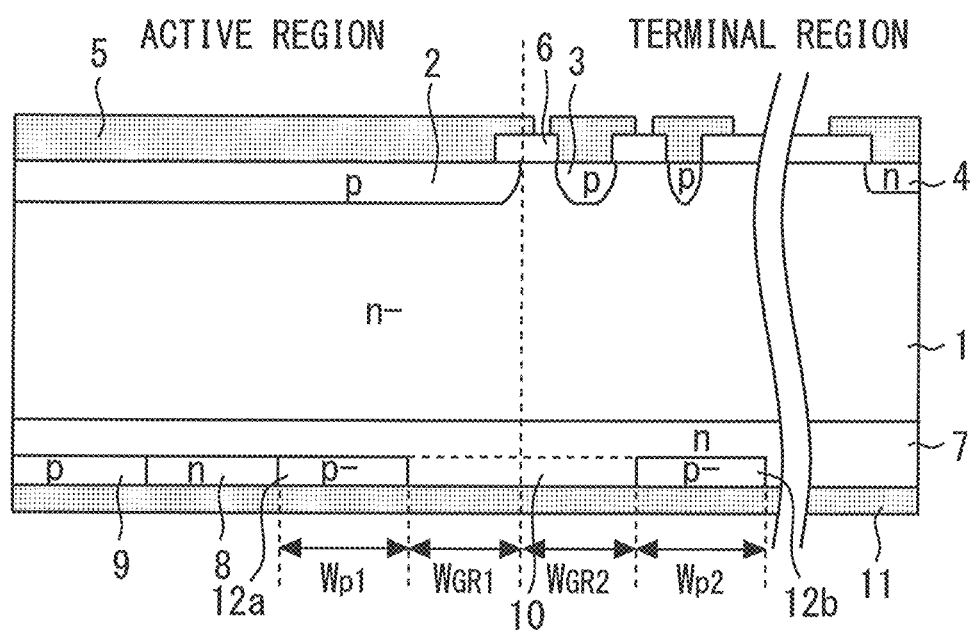
FIG. 24 is a cross-sectional view illustrating a semiconductor device according to Embodiment 10 of the present invention.

FIG. 24 is a cross-sectional view illustrating a semiconductor device according to Embodiment 10 of the present invention. In the present embodiment, p⁻ type layers 12a and 12b having a lower concentration than that of the p type cathode layer 9 are formed on the rear surface of the n type buffer layer 7 and located adjacent to the active region side and the terminal region side of the n type layer 10 respectively. The rest of the configuration is the same as that of Embodiment 8 and effects similar to those of Embodiment 8 can be obtained. Widths Wp1 and Wp2 of the p⁻ type layers 12a and 12b are preferably designed to be on the order of several tens of µm as in the case of Embodiment 5.

Embodiment 11

Figure 25:
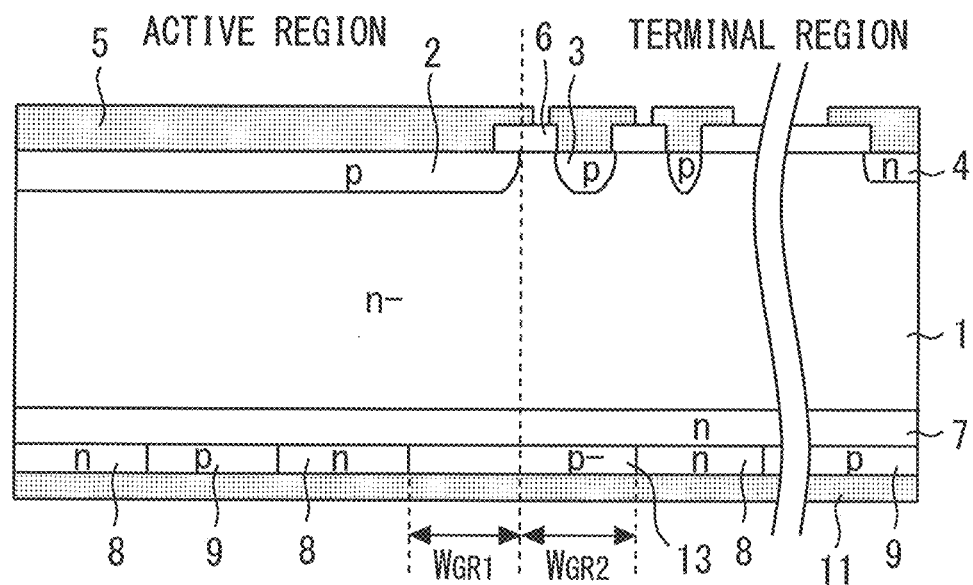
FIG. 25 is a cross-sectional view illustrating a semiconductor device according to Embodiment 11 of the present invention.

FIG. 25 is a cross-sectional view illustrating a semiconductor device according to Embodiment 11 of the present invention. In the present embodiment, instead of the n type layer 10 according to Embodiment 1, a p⁻ type layer 13 having a lower concentration than that of the p type cathode layer 9 is formed on the rear surface of the n type buffer layer 7 in the boundary region between the active region and the terminal region side by side with the n type cathode layer 8 and the p type cathode layer 9. An extending distance of the p⁻ type layer 13 to the active region side with an end portion of the active region as a starting point is WGR1 and an extending distance of the p⁻ type layer 13 to the terminal region side with the end portion of the active region as a starting point is WGR2, WGR1 and WGR2 satisfying 10 µm≤WGR1≤500 µm and 10 µm≤WGR2≤500 µm. The rest of the configuration is the same as that of Embodiment 1 and effects similar to those of Embodiment 1 can be obtained.

Embodiment 12

Figure 26:
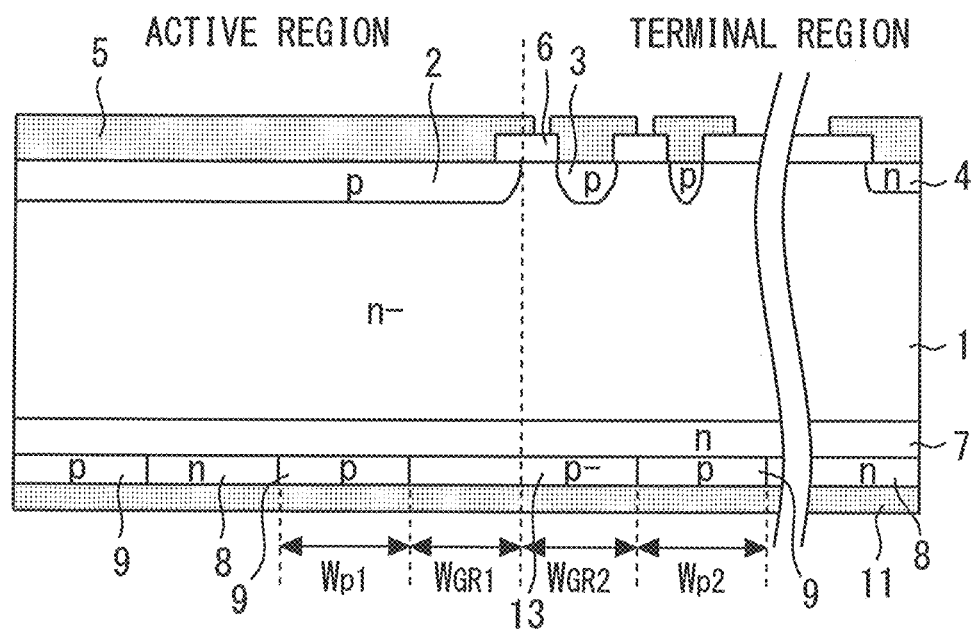
FIG. 26 is a cross-sectional view illustrating a semiconductor device according to Embodiment 12 of the present invention.

FIG. 26 is a cross-sectional view illustrating a semiconductor device according to Embodiment 12 of the present invention. The p type cathode layers 9 having widths Wp1 and Wp2 are located adjacent to the active region side and the terminal region side of the p⁻ type layer 13 respectively. The rest of the configuration is the same as that of Embodiment 11 and effects similar to those of Embodiment 11 can be obtained. The widths Wp1 and Wp2 are preferably designed to be on the order of several tens of µm as in the case of Embodiment 5.

Embodiment 13

Figure 27:
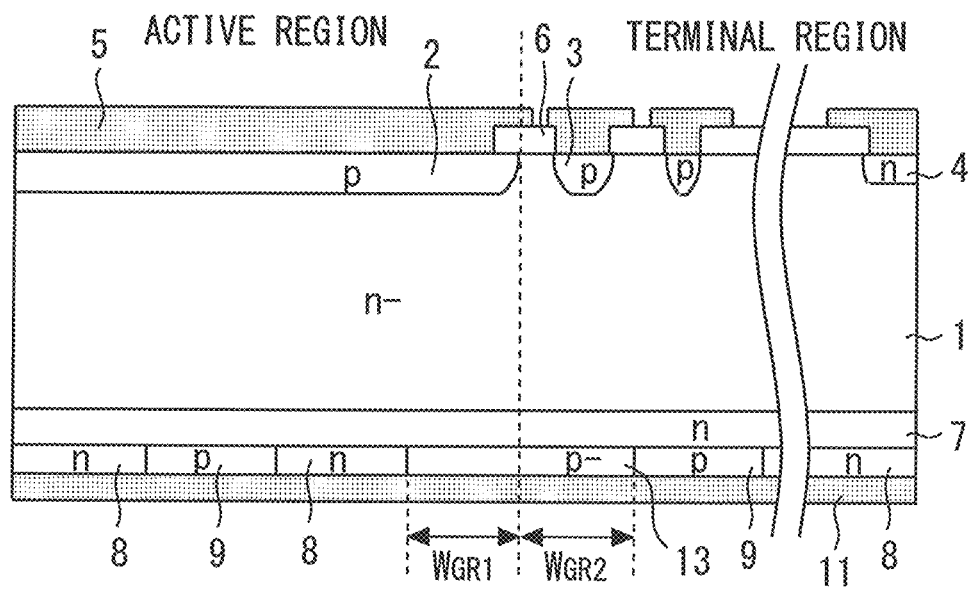
FIG. 27 is a cross-sectional view illustrating a semiconductor device according to Embodiment 13 of the present invention.

FIG. 27 is a cross-sectional view illustrating a semiconductor device according to Embodiment 13 of the present invention. In the present embodiment, the n type cathode layer 8 is located adjacent to the end portion on the active region side of the p⁻ type layer 13. The rest of the configuration is the same as that of Embodiment 11 and effects similar to those of Embodiment 11 can be obtained.

Embodiment 14

Figure 28:
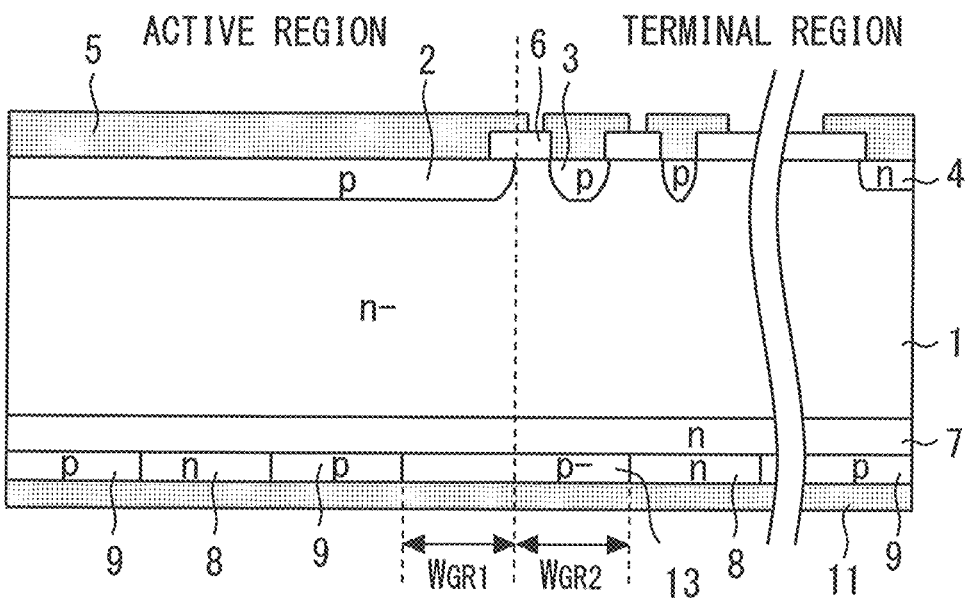
FIG. 28 is a cross-sectional view illustrating a semiconductor device according to Embodiment 14 of the present invention.

FIG. 28 is a cross-sectional view illustrating a semiconductor device according to Embodiment 14 of the present invention. In the present embodiment, the n type cathode layer 8 is located adjacent to the end portion on the terminal region side of the p⁻ type layer 13. The rest of the configuration is the same as that of Embodiment 11 and effects similar to those of Embodiment 11 can be obtained.

Embodiment 15

Figure 29:
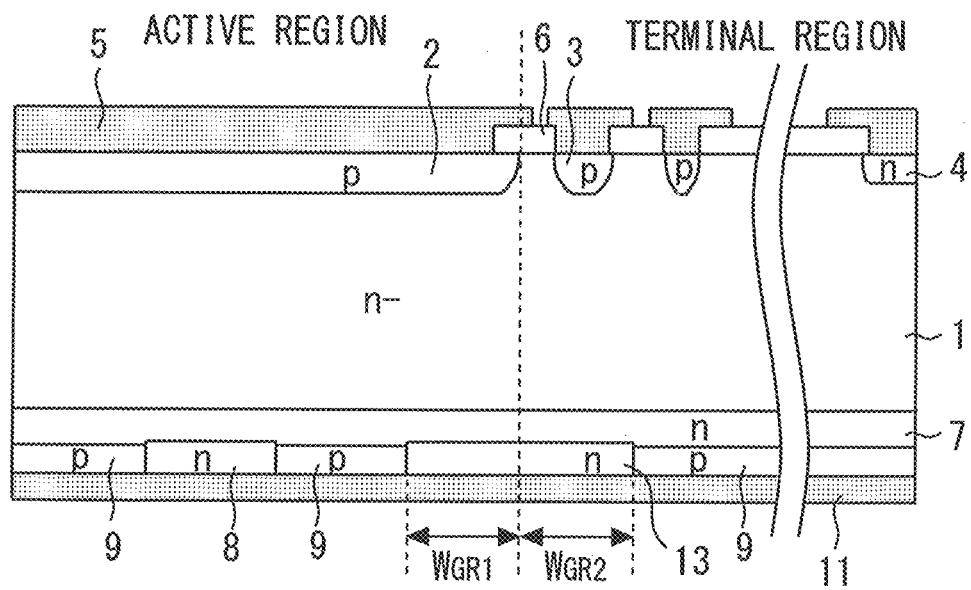
FIG. 29 is a cross-sectional view illustrating a semiconductor device according to Embodiment 15 of the present invention.

FIG. 29 is a cross-sectional view illustrating a semiconductor device according to Embodiment 15 of the present invention. The n type layer 10 and the n type cathode layer 8 have a greater depth than that of the p type cathode layer 9, and have a peak concentration more than twice as high as that of the p type cathode layer 9. Impurity of the p type cathode layer 9 is contained in the n type layer 10 and the n type cathode layer 8. With this configuration, after all the p type cathode layers 9 are formed, the n type layer 10 and the n type cathode layer 8 can be formed by partially canceling them. Therefore, it is possible to simplify the process flow and eliminate possible influences of a pattern deviation on the electric characteristic.

Embodiment 16

Figure 30:
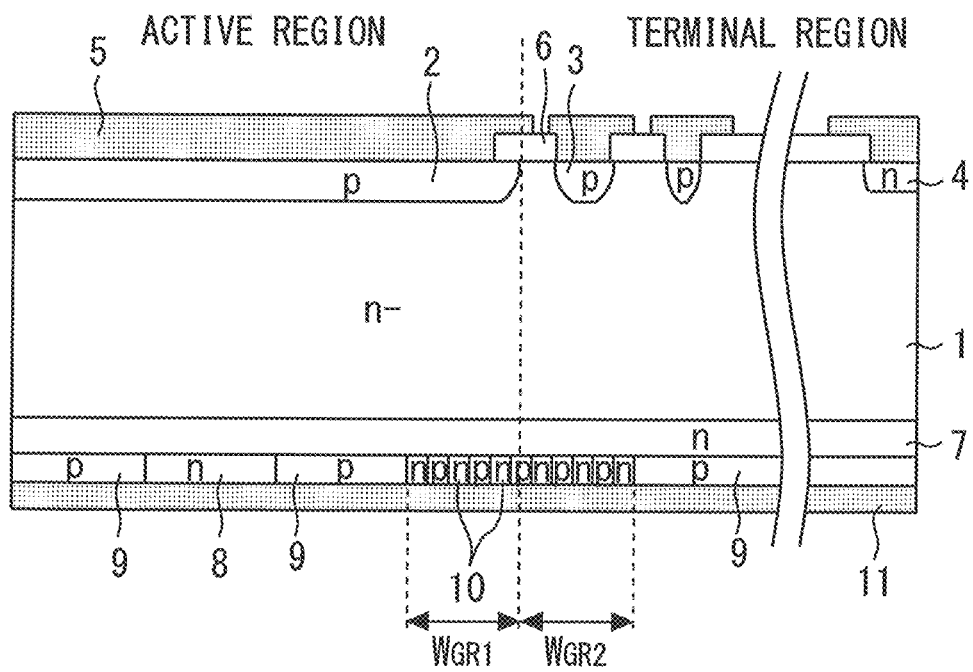
FIG. 30 is a cross-sectional view illustrating a semiconductor device according to Embodiment 16 of the present invention.
Figure 31:
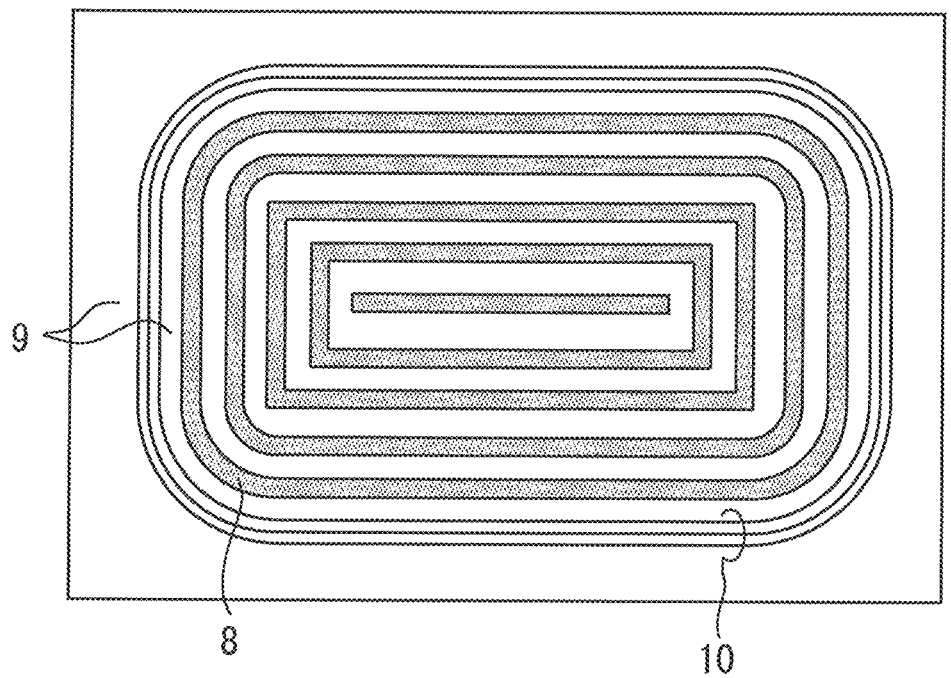
FIG. 31 is a bottom view illustrating the semiconductor device according to Embodiment 16 of the present invention.
Figure 32:
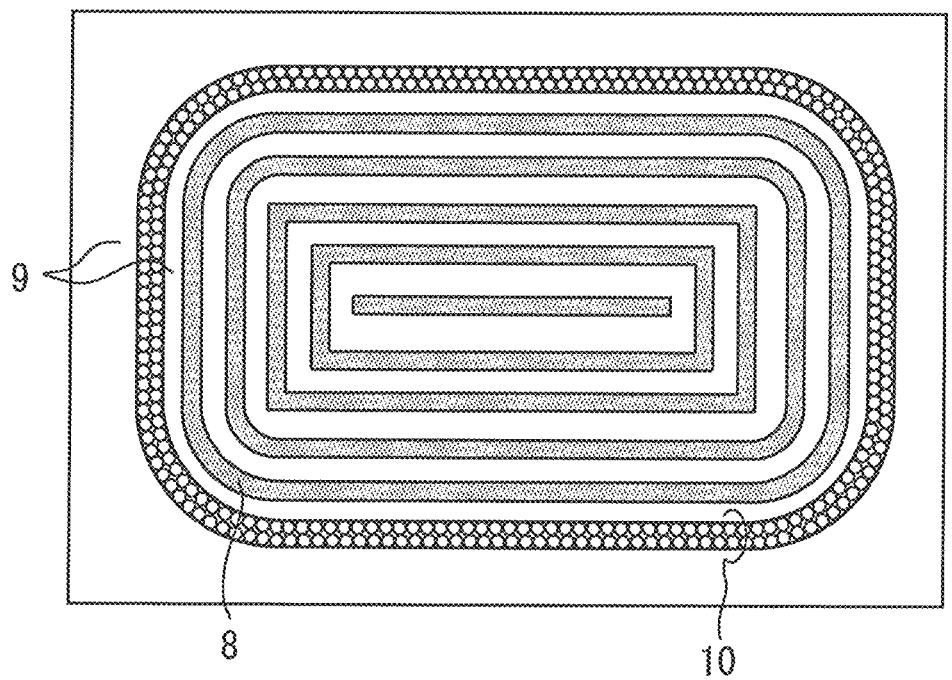
FIG. 32 is a bottom view illustrating a modification of the semiconductor device according to Embodiment 16 of the present invention.

FIG. 30 is a cross-sectional view illustrating a semiconductor device according to Embodiment 16 of the present invention. FIG. 31 is a bottom view illustrating the semiconductor device according to Embodiment 16 of the present invention. The n type layer 10 according to Embodiments 1 to 10 is arranged in a shape of a plurality of rings in a plan view. FIG. 32 is a bottom view illustrating a modification of the semiconductor device according to Embodiment 16 of the present invention. The n type layer 10 of Embodiments 1 to 10 is arranged in a shape of dots in a plan view. Alternatively, the p⁻ type layer 13 of Embodiments 11 to 15 may also be arranged in a shape of rings or dots in a plan view. Effects similar to those of Embodiments 1 to 15 may be obtained in this case, too.

Note that the semiconductor devices of the above-described embodiments are not limited to ones formed of silicon, but may be formed of a wide band gap semiconductor having a wider band gap than silicon. Examples of the wide band gap semiconductor include silicon carbide, nitride-gallium-based material or diamond. The semiconductor device formed of such a wide band gap semiconductor has a high withstand voltage and a high allowable current density, and can therefore be downsized. Using this downsized semiconductor device also allows a semiconductor module incorporating such a device to be downsized. Moreover, since the semiconductor device has high heat resistance, it is possible to downsize radiator fins of its heat sink, adopt an air cooling system instead of a water cooling system and further downsize the semiconductor module. Furthermore, the device has low power loss and high efficiency, and it is thereby possible to provide a more efficient semiconductor module.

Diodes of low and medium withstand voltage classes of 1200 V and 1700 V have been described in the above-described embodiments as examples, but the above-described effects can be achieved irrespective of withstand voltage classes by a semiconductor device incorporating a parasitic bipolar transistor structure such as IGBT or RC-IGBT. Furthermore, a case has been described so far where the termination structure is an FLR, but without being limited to this, similar effects can also be achieved with a VLD (variable lateral doping) structure or a RESURF (reduced surface field) structure.

REFERENCE SIGNS LIST 1 n⁻ type drift layer; 2 p type anode layer; 7 n type buffer layer; 8 n type cathode layer; 9 p type cathode layer; 10 n type layer; 12a,12b,13 p⁻ type layer

The invention claimed is:
1. A semiconductor device wherein a terminal region is disposed outside an active region, comprising:
an n type drift layer having a front surface and a rear surface facing each other;
a p type anode layer formed on the front surface of the n type drift layer in the active region, an end portion of the p type anode layer along a horizontal direction coinciding with an end portion of the of the active region;
an n type buffer layer formed on the rear surface of the n type drift layer;
an n type cathode layer and a p type cathode layer formed side by side on a rear surface of the n type buffer layer;
an n type layer formed on the rear surface of the n type buffer layer in a boundary region between the active region and the terminal region side by side with the n type cathode layer and the p type cathode layer; and
a cathode electrode formed in the active region and forming an ohmic contact with the n type cathode layer and the p type cathode layer, wherein
a region at the front surface directly adjacent to the end portion of the p type anode layer is an n type region,
an extending distance of the n type layer to the active region side with the end portion of the active region as a starting point is represented by WGR1,
WGR1 satisfies 100 µm≤WGR1≤500 µm, the n type layer is extended to the terminal region side, and the p type cathode layer is continuously provided in the terminal region and located adjacent to an end portion on the terminal region side of the n type layer.

2. The semiconductor device according to claim 1, wherein an extending distance of the n type layer to the terminal region side with the end portion of the active region as a starting point is represented by WGR2, and WGR2 satisfies 100 µm≤WGR2≤500 µm.

3. The semiconductor device according to claim 2, wherein WGR2>WGR1.

4. The semiconductor device according to claim 1, wherein the n type layer has a same impurity concentration as that of the n type cathode layer.

5. The semiconductor device according to claim 4, wherein the n type layer and the n type cathode layer have a greater depth than that of the p type cathode layer, and have a peak concentration more than twice as high as that of the p type cathode layer, and impurity of the p type cathode layer is contained in the n type layer and the n type cathode layer.

6. The semiconductor device according to claim 1, wherein the n type layer has a same impurity concentration as that of the n type buffer layer.

7. The semiconductor device according to claim 6, wherein the n type cathode layer is located adjacent to an end portion on the active region side of the n type layer.

8. The semiconductor device according to claim 1, wherein the p type cathode layer is located adjacent to an end portion on the active region side of the n type layer.

9. The semiconductor device according to claim 1, further comprising a p type layer formed on the rear surface of the n type buffer layer, located adjacent to at least one of the active region side and the terminal region side of the n type layer and having a lower concentration than that of the p type cathode layer.

10. The semiconductor device according to claim 1, wherein then type layer is arranged in a shape of dots in a plan view.

* * * * *